US011397209B2

(12) United States Patent
Akin et al.

(10) Patent No.: US 11,397,209 B2
(45) Date of Patent: Jul. 26, 2022

(54) METHODS OF MONITORING CONDITIONS ASSOCIATED WITH AGING OF SILICON CARBIDE POWER MOSFET DEVICES IN-SITU, RELATED CIRCUITS AND COMPUTER PROGRAM PRODUCTS

(71) Applicant: Board of Regents, The University of Texas System, Austin, TX (US)

(72) Inventors: Bilal Akin, Richardson, TX (US); Shi Pu, Plano, TX (US); Enes Ugur, Plano, TX (US); Fei Yang, Plano, TX (US); Chi Xu, Plano, TX (US); Bhanu Teja Vankayalapati, Richardson, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 66 days.

(21) Appl. No.: 16/897,448

(22) Filed: Jun. 10, 2020

(65) Prior Publication Data
US 2020/0400738 A1 Dec. 24, 2020

Related U.S. Application Data

(60) Provisional application No. 62/863,096, filed on Jun. 18, 2019.

(51) Int. Cl.
*G01R 31/26* (2020.01)
(52) U.S. Cl.
CPC ..... *G01R 31/2621* (2013.01); *G01R 31/2642* (2013.01); *G01R 31/2644* (2013.01)

(58) Field of Classification Search
CPC ............ G01R 31/2621; G01R 31/2642; G01R 31/2644; G01R 31/2601; H05K 7/1432;
(Continued)

(56) References Cited

U.S. PATENT DOCUMENTS 8,957,723 B2 * 2/2015 Zoels ..................... H03K 17/18
327/108
9,494,657 B2 * 11/2016 Khan ....................... H02S 50/10
(Continued)

OTHER PUBLICATIONS

Choi, et al; *Reliability Improvement of Power Converters by Means of Condition Monitoring of IGBT Modules*; IEEE Transactions on Power Electronics, vol. 32, No. 10; Oct. 2017; pp. 7990-7997.
(Continued)

*Primary Examiner* — Vinh P Nguyen
(74) *Attorney, Agent, or Firm* — Stanek Lemon Crouse & Meeks, P.A

(57) ABSTRACT

A method of monitoring a condition of a SiC MOSFET can include (a) applying a first test gate-source voltage across a gate-source of a SiC MOSFET in-situ, the first test gate-source voltage configured to operate the SiC MOSFET in saturation mode to generate a first drain current in the SiC MOSFET, (b) applying a second test gate-source voltage across the gate-source of the SiC MOSFET in-situ, the second test gate-source voltage configured to operate the SiC MOSFET in fully-on mode to generate a second drain current in the SiC MOSFET, (c) determining a drain-source saturation resistance using the first drain current to provide an indication of a degradation of a gate oxide of the SiC MOSFET; and (d) determining a drain-source on resistance using the second drain current to provide an indication of a degradation of contact resistance of the SiC MOSFET.

10 Claims, 14 Drawing Sheets

(58) Field of Classification Search
CPC ........... H01L 29/45; H01L 2924/13055; H01L 27/0617; H01L 29/1066; H01L 29/41766; H01L 29/7455; H01L 29/7722; H01L 29/7832; H01L 2924/13062; H01L 21/0455; H01L 29/0646; H01L 29/66893; H01L 29/7801; H01L 29/42312; H01L 29/42316; H01L 29/4234; H01L 29/432; H01L 29/435; H01L 29/49; H01L 29/4908; H01L 2924/13091; H01L 27/0248; H01L 2924/3011; H01L 31/02; H01L 29/7815; H01L 21/761; H02J 7/0047; H02J 7/24; H02J 7/1446; H02J 7/2434; G06F 30/20; G06F 30/398; G06F 2119/02; G06F 2119/12; G06F 30/367; G06F 2119/08; H03K 17/6871; H03K 17/063

See application file for complete search history.

(56) References Cited

U.S. PATENT DOCUMENTS

| | | | | |
|---|---|---|---|---|
| 10,261,122 | B2* | 4/2019 | Sjoroos | G01R 31/2608 |
| 10,504,995 | B1* | 12/2019 | Domeij | H01L 27/085 |
| 10,605,854 | B2* | 3/2020 | Sathik | G01R 31/2621 |
| 11,070,197 | B1* | 7/2021 | Wang | H03K 17/145 |
| 11,183,566 | B1* | 11/2021 | Sundaresan | H01L 29/0607 |
| 2020/0408829 | A1* | 12/2020 | Ugur | G01R 31/2621 |

OTHER PUBLICATIONS

Singh et al; *Evaluation of $V_{ce}$ at Inflection Point for Monitoring Bond Wire Degradation in Discrete Packaged IGBTs*; IEEE Transactions on Power Electronics, vol. 32, No. 4; Apr. 2017; pp. 2481-2484.

Hanif, et al; *Detection of Gate Oxide and Channel Degradation in SiC Power MOSFETs using Reflectometry*; IEEE Xplore; (2017); pp. 383-387.

Dusmez et al; *In situ Condition Monitoring of High-Voltage Discrete Power MOSFET in Boost Converter Through Software Frequency Response Analysis*; IEEE Transactions on Industrial Electronics, vol. 63, No. 12; Dec. 2016; pp. 7693-7702.

Pu et al; *In situ Degradation Monitoring of SiC MOSFET Based on Switching Transient Measurement*; IEEE Transactions on Industrial Electronics, vol. 67, No. 6; Jun. 2020; p. 5092-5100.

Pu et al; *SiC MOSFET Aging Detection Based on Miller Plateau Voltage Sensing*; IEEE Xplore; (2019) 6 pages.

Erturk et al. *Real-Time Aging Detection of SiC MOSFETs*; IEEE Transactions of Industry Applications, vol. 55, No. 1; Jan./Feb. 2019; p. 600-609.

Ren et al; *Real-Time Aging Monitoring for Power MOSFETs using Threshold Voltage*; IEEE Xplore; (2016); p. 441-446.

All et al; *A Simple Plug-In Circuit for IGBT Gate Drivers to Monitor Device Aging*; IEEE Xplore; (2018); p. 45-55.

Aichinger et al.; *Threshold Voltage Peculiarities and Bias Temperature Instabilities of SiC MOSFETs*; Microelectronics Reliability 80; (2018); p. 68-78.

Santini et al.; *Accelerated Degradation Data of SiC MOSFETS for Lifetime and Remaining Useful Life Assessment*; Microelectronics Reliability 54 (2014); pp. 1718-1723.

Nguyen et al; *Gate Oxide Reliability Issues of SIC MOSFETs Under Short-Circuit Operation*; IEEE Transactions on Power Electronics, vol. 30, No. 5; May 2015; p. 2445-2455.

Ouaida et al; *Gate Oxide Degradation of SiC MOSFET in Switching Conditions*; IEEE Electron Device Letters, vol. 35, No. 12, Dec. 2014; pp. 1284-1286.

Pu et al; *Real-Time Degradation Monitoring of SiC-MOSFETs through Readily Available System Microcontroller*, IEEE Xplore; 978-1-5386-3117 (2017); pp. 378-382.

Chen et al.; A Review of SiC Power Module Packaging: Layout, Material System and Integration; CPSS Transactions on Power Electronics and Applications, vol. 2, No. 3; Sep. 2017; pp. 170-186.

* cited by examiner

DRAIN-SOURCE ON-RESISTANCE MEASUREMENT OF DUT-1

| $I_{d-sat}$ | $R_{ds-circuit}$ | $R_{ds-ref}$ | $\|R_{ds-circuit} - R_{ds-ref}\|$ |
|---|---|---|---|
| 1A | 308.11mΩ | 309mΩ | 0.89mΩ |
| 1.5A | 308.22mΩ | 309mΩ | 0.78mΩ |
| 2A | 308.19mΩ | 309mΩ | 0.81mΩ |
| 2.5A | 308.57mΩ | 309mΩ | 0.43mΩ |

METHODS OF MONITORING CONDITIONS ASSOCIATED WITH AGING OF SILICON CARBIDE POWER MOSFET DEVICES IN-SITU, RELATED CIRCUITS AND COMPUTER PROGRAM PRODUCTS

CLAIM FOR PRIORITY

The present Application claims priority to U.S. Provisional Application Ser. No. 62/863,096 entitled SiC MOSFET Condition Monitoring System and Method, filed in the U.S.P.T.O on Jun. 18, 2019, the entire disclosure of which is hereby incorporated herein by reference.

STATEMENT OF GOVERNMENT SUPPORT

This invention was made with government support under Grant No. 1454311 awarded by the National Science Foundation. The government has certain rights in the invention.

FIELD

The present invention relates to the field of electronics in general, and more particularly, to SiC power MOSFET devices.

BACKGROUND

Mechanical stresses may accumulate during the operation of silicon carbide (SiC) power devices at the bond-wire contact points and at the die-attach solder joints due to a mismatch in coefficient of thermal expansion (CTE). Accordingly, the mechanical stresses may contribute to package related aging mechanisms in SiC device. This could eventually lead to bond-wire liftoff or die attach solder delamination. It is known to monitor degradation in discrete IGBTs, however, the precursors used in those techniques may not be directly applicable to SiC MOSFETs due to the differences in the physics of operation.

Bond wire lift off or die attach solder delamination can lead to an increase in MOSFET on-state resistance (Rds-on). Although, Rds-on is also affected to a degree by the drift in gate threshold voltage over aging, it shows a clear change with package related degradation. Rds-on can be calculated by using high frequency network reflectometry. By applying high frequency gate signals to a fully conducting MOSFET switch, the magnitude of the bounced back voltage is used to measure the device impedance variation over aging. However, this method is not particularly suited to on-board implementation. A software response analysis based online aging detection method has been proposed for a boost converter. In this method, the increment in switch Rds-on over aging is indirectly detected by measuring the change in magnitude of the converter frequency response at the double pole frequency. This approach, however, may be limited to single switch converter topologies.

The voltage drop across power source and gate source may also be utilized for SiC MOSFET modules with Kelvin source connection. Such degradation monitoring method cannot serve for packages with common source structure.

Device thermal conductivity has also been proposed as an effective way to detect package degradation. However, in order to obtain accurate device temperature, extra on-die temperature sensors may need to be implemented inside the device which may lead to extra cos.

Device reverse body diode forward voltage ($V_{SD}$) with large current injection has also been proposed as a potential aging signature for package wear-out monitoring. However, in most converter designs, the SiC switches are shunted with junction barrier Schottky (JBS) diodes for reverse current conduction, preventing the use of $V_{SD}$ as an effective precursor for on-board condition monitoring.

Another prominent aging mechanism in SiC MOSFETs is the tunneling of electrons into near interface oxide traps at the SiC/SiO2 interface. The relatively thin gate oxide layer and larger electric field in the oxide layer, also makes SiC devices less tolerant to oxide degradation. Various precursors have been proposed to detect gate oxide degradation in SiC MOSFETs. Device switching transient such as turn-on time and Miller plateau voltage ($V_{mp}$) can be used for aging detection. However, detection methods based on $V_{mp}$ may require a certain load current flowing through the device's drain-source channel.

Another degradation monitoring method based on gate leakage current ($I_{gss}$) measurement has been proposed. However, $I_{gss}$ may not change consistently with aging and only shows a dramatic increase just before device failure and hence may not be a suitable early warning precursor. On-board threshold voltage ($V_{th}$) measurement circuits to measure the Vth drift with aging have also been proposed. Although Vth drift can be a direct indicator of oxide degradation, it usually is challenging to reliably measure it due to the fast, high resolution circuitry required. In-situ $V_{th}$ detection circuit has also been proposed for IGBT aging detection. However, this approach may require additional circuitry and may be limited to detection of gate degradation only. The body diode forward drop ($V_{SD}$) at 0V Vgs and low conduction current has also been proposed as a valid die-related aging precursor, but may present implementation challenges to be implemented on-board for aging detection due to the external JBS diode.

SUMMARY

Embodiments according to the invention can provide methods of monitoring conditions associated with aging of SiC power MOSFET devices in-situ, related circuits and computer program products. Pursuant to these embodiments, a method of monitoring a condition of a SiC MOSFET can include (a) applying a first voltage across a gate-source of a SiC MOSFET in-situ that is greater than a specified threshold voltage for the SiC MOSFET to conduct a current though a channel region in the SiC MOSFET, (b) determining whether the current exceeds a target current that is pre-selected to monitor a drain-source saturation mode resistance of the SiC MOSFET in-situ, (c) increasing the first voltage by an increment and iteratively performing (a) and (b) until the current exceeds the target current whereupon the first voltage is designated as a test gate-source voltage to be used in monitoring the drain-source saturation mode resistance of the SiC MOSFET in-situ and then detecting a power-on event associated with operation of the SiC MOSFET in-situ for an application that provides an in-situ drain-source voltage across the SiC MOSFET in-situ, applying the test gate-source voltage across the gate-source of the SiC MOSFET, determining a drain current conducted though the channel region in the SiC MOSFET responsive to applying the test gate-source voltage and determining the drain-source saturation mode resistance for the SiC MOSFET based on the drain current and the in-situ drain-source voltage.

In some embodiments, a method of monitoring a condition of a SiC MOSFET can include (a) detecting a power-on event associated with operation of a SiC MOSFET located in-situ in an application circuit that provides an in-situ drain-source voltage across the SiC MOSFET in-situ, (b) applying a test gate-source voltage across a gate-source of the SiC MOSFET, the test gate-source voltage being greater than a specified threshold voltage for the SiC MOSFET and configured to operate the SiC MOSFET in saturation mode with the in-situ drain-source voltage across the SiC MOSFET in-situ, (c) measuring a drain current conducted though a channel region in the SiC MOSFET responsive to applying the test gate-source voltage to a gate of the SiC MOSFET and with the in-situ drain-source voltage across the drain and source of the SiC MOSFET in-situ and (d) determining a drain-source saturation mode resistance for the SiC MOSFET in-situ based on the drain current and the in-situ drain-source voltage.

In some embodiments, a method of monitoring a condition of a SiC MOSFET can include (a) applying a first voltage across a gate-source of a SiC MOSFET that is greater than a specified threshold voltage for the SiC MOSFET to conduct a current though a channel region in the SiC MOSFET, (a) determining whether the current exceeds a target current pre-selected to evaluate a drain-source saturation mode resistance of the SiC MOSFET and (b) increasing the first voltage by an increment and iteratively performing (a) and (b) until the current exceeds the target current whereupon the first voltage is designated as a test gate-source voltage to be used in monitoring the drain-source saturation mode resistance of the SiC MOSFET.

In some embodiments, a circuit for monitoring a condition of a SiC MOSFET, can include a variable gate driver circuit coupled to a gate of the SiC MOSFET in-situ in an application circuit, the variable gate driver circuit configured to apply a test gate-source voltage across a gate-source of the SiC MOSFET, where the test gate-source voltage is greater than a specified threshold voltage for the SiC MOSFET and the test gate-source voltage is configured to operate the SiC MOSFET in saturation mode with an in-situ drain-source voltage applied across the SiC MOSFET in-situ and a current measuring circuit coupled to a drain or to a source of the SiC MOSFET in-situ, the current measuring circuit configured to measure a drain current conducted though a channel region in the SiC MOSFET responsive to applying the test gate-source voltage with the in-situ drain-source voltage applied across the drain and source of the SiC MOSFET in-situ.

In some embodiments, a method of monitoring a condition of a SiC MOSFET can include (a) applying a first test gate-source voltage across a gate-source of a SiC MOSFET in-situ, the first test gate-source voltage configured to operate the SiC MOSFET in saturation mode to generate a first drain current in the SiC MOSFET, (b) applying a second test gate-source voltage across the gate-source of the SiC MOSFET in-situ, the second test gate-source voltage configured to operate the SiC MOSFET in fully-on mode to generate a second drain current in the SiC MOSFET, (c) determining a drain-source saturation resistance using the first drain current to provide an indication of a degradation of a gate oxide of the SiC MOSFET; and (d) determining a drain-source on resistance using the second drain current to provide an indication of a degradation of contact resistance of the SiC MOSFET.

BRIEF DESCRIPTION OF THE FIGURES

FIG. 12 is a table listing measured Rds-on values from single pulse test circuit (Rds-circuit) compared to curve tracer measurement (Rds-ref) in some embodiments according to the invention.

DETAILED DESCRIPTION OF EMBODIMENTS ACCORDING TO THE INVENTION

Figure 1:
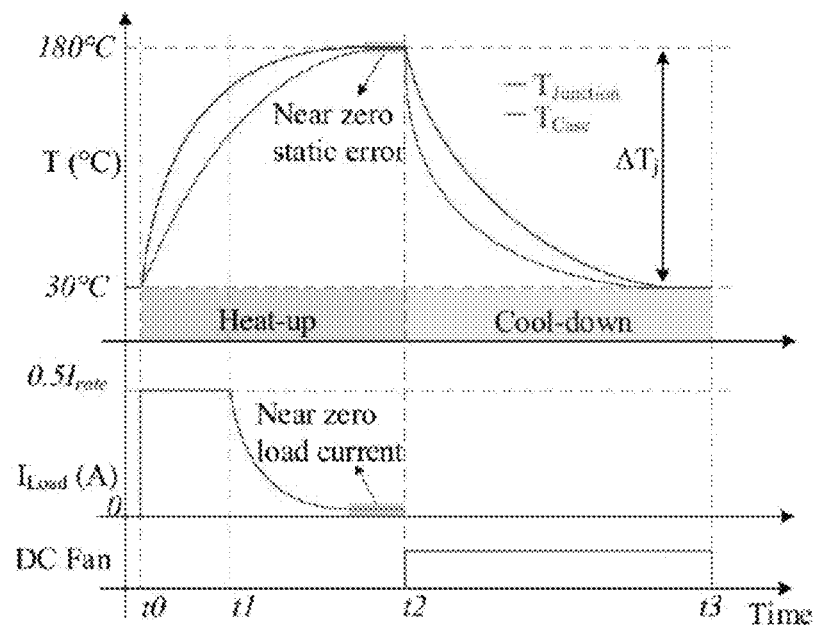
FIG. 1 is a graph illustrating power cycling of SiC MOSFET devices to provide accelerated aging in some embodiments according to the invention.

Exemplary embodiments of the present disclosure are described in detail with reference to the accompanying drawings. The disclosure may, however, be exemplified in many different forms and should not be construed as being limited to the specific exemplary embodiments set forth herein. Rather, these exemplary embodiments are provided so that this disclosure will be thorough and complete, and will fully convey the scope of the disclosure to those skilled in the art.

As appreciated by the present inventors, a comprehensive SiC MOSFET degradation monitoring method can detect both die (i.e., gate oxide degradation) and package (i.e., contact degradation) related aging issues for SiC MOSFETs. This approach can monitor the device's drain-source resistance when operating in the saturation region and monitoring the device's drain-source resistance when operating in the full-on region (sometimes referred to as the ohmic region) over time by determining these values when the device powers-up. In some embodiments according to the invention, this approach can provide monitoring of a general class of phase leg based converters using SiC MOSFETs.

In some embodiments, the saturation region on state resistance (Rds-sat) of SiC MOSFET can be used as an effective precursor for die related aging detection while the Rds-on value can be used as the precursor for detection of package related degradation. Still further, an in-situ measurement of Rds-sat and Rds-on can be made using readily available system sensors at system startup. This may be done using a software controlled diagnostic routine which may be run at system startup. In some embodiments according to the invention, during the routine, one switch of a phase leg is turned on at a reduced gate voltage such that it operates in saturation region, whereas the other switch in the same leg is turned on at full gate voltage (so as to operate in fully-on mode) whereas all other switches in other legs are kept off. The input DC source conducts a current through the phase leg under test, the value of which is limited by the device operating in saturation mode. The values from the system current sensor and bus voltage sensor can be used to calculate the Rds-sat value of the device operating in saturation mode. A voltage measurement circuit may be used to measure the voltage across the switch that is fully turned on. The Rds-on of the switch is calculated by dividing this measured voltage by the current value from system current sensor. Accordingly, in some embodiments according to the invention both devices in the leg under test can be monitored by measuring the Rds-sat value of the first device and measuring the Rds-on value for the second device. In further embodiments, the process can then be repeated but configured to operate the first device in fully-on mode and to operate the second device in saturation mode. Accordingly, Rds-on and Rds-sat values for both devices in the same leg can be monitored using a pair of tests.

The above process is repeated for all devices and phase legs such that at the end of the routine, Rds-sat and Rds-on values of each of the devices in the converter are available. Accordingly, comprehensive aging detection of SiC devices, particularly gate oxide degradation detection, may be simplified compared to conventional approaches. Furthermore, the integration of Rds-sat and Rds-on measurement into the same routine at system startup can simplify the Vds measurement circuit needed for Rds-on calculation. Since Vds is measured at system startup and not during normal converter operation (when the MOSFETs may be switching at several kHz), the Vds measurement circuit can be relatively simple. Further, the use of system sensors for current sensing and bus voltage sensing may reduce the cost of implementation. Also, it is shown through the experimental data herein that the proposed approach may be applicable to various converter topologies and configurations.

As used herein, the term "in-situ" includes configurations where the devices being monitored are embedded in an application circuit, such as a driver circuit for a multi-phase motor. Further, the components used to carry out the operations are also included in the application circuit and are functional during normal operations when the devices are carrying our application functions (such as operating the motor under a load). Still further, the devise being monitored can be operated according to embodiments of the invention after power up, but before applications operations being. Still further in some embodiments, such as to establish a gate voltage for a device to generate a sufficient drain current for testing, operations according to embodiments of the invention may be carried out during the first time that the system is powered up or the first time that the system is powered up after in-situ testing is enabled. Further, it will be understood that remote monitoring may also be enabled by service engineers or maintenance personnel, which may remotely monitor aging and take preventive steps to insure continued up-time.

A group of SiC MOSFET devices were subjected to accelerated aging using DC power cycling for experimental evaluation in some embodiments according to the invention. In DC power cycling, devices are subjected to large repetitive thermal swings through self-heating and forced cooling. Since such electro-thermal stresses aggressively induce both package and die related aging in SiC devices, they mimic actual aging mechanisms that occur during normal converter operation better than other approaches. In this evaluation, repetitive junction temperature (Tj) swings, defined as "aging cycles", were applied to the devices under test (DUTs). The lower and upper temperature limits were set at 30° C. and 180° C. respectively. Specifically, each aging cycle included two consecutive time intervals as shown in FIG. 1.

In this evaluation, three DUTs (DUT1-DUT3) with TO-247-3 package were aged. A thermocouple was tightly attached to the DUT's drain tab for temperature sensing and DC fans were used to cool devices down. The operation principle of the aging bench is described below:

During a time t0-t1, the device was heated by passing a constant current equal to half of the rated current through it in its on state causing conduction loss. Specifically, 5 A $I_{Load}$ was applied to the device. This interval lasted until the temperature reading approaches near the upper limit, which took about 20 seconds. During a time t1-t2, the injected load current $I_{Load}$ is controlled by a system microcontroller to gradually decrease to near-zero level. During this period, device case temperature is almost equal to the junction temperature and eventually there is negligible Tj mismatch.

This phase took about 40 seconds. During a time t2-t3, the DUT was turned off. A DC fan was turned on which was controlled by the microcontroller. Even though the temperature reading can reach the lower limit within 90 seconds, this period was set to 2 minutes for DUTs to ensure that the devices were sufficiently cooled-down.

Figure 2:
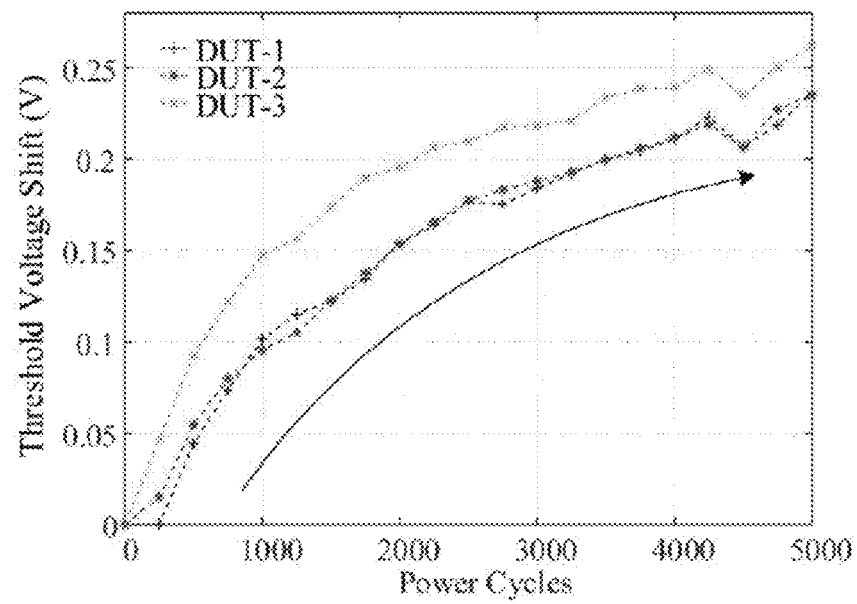
FIG. 2 is a graph illustrating an increasing Vth trend as a function of aging where Vth is defined as the gate voltage applied Vth of the aged devices in some embodiments according to the invention.

In SiC devices, thermally triggered degradation processes can cause defect charges to be trapped in the gate oxide. These charged defects are attracted by applied gate bias and weaken the ability of gate charge to generate inversion layer in the body region. As a result, higher gate voltage (Vgs) may be needed to form the conduction channel leading to an increase in Vth. Both interface traps and oxide traps generated during aging can contribute to Vth variation. This can be verified from the characterization of Vth of the aged devices as shown in FIG. 2. The graph shows an increasing Vth trend over aging where Vth is defined as the gate voltage applied when 1.25 mA drain current is conducted.

The device channel resistance is expressed as:

$$R_{CH} = \frac{L_{CH}}{W \mu_{ni} C_{ox}(V_{gs} - V_{th})} \quad (1)$$

where Cox is the gate oxide capacitance per unit area, LCH is the channel length, µni is the electron mobility and Vgs is the applied positive gate bias. From Eq. 1, it is evident that the increase in Vth due to device degradation leads to higher channel resistance for a fixed Vgs. This is because the formation of the conduction channel is weakened by device aging effect. Furthermore, the channel resistance in saturation region (Rds-sat) is expected to increase throughout aging. Hence, with applied electro-thermal stresses, the device drain current is expected to be negatively affected for a fixed positive gate bias. Therefore, Rds-sat change with aging may be an indirect indicator of Vth drift and hence an effective precursor for gate oxide degradation monitoring. Furthermore, since the value of Rds-sat is several orders of magnitude higher than package resistances (such as lead resistance, bond-wire resistance, solder resistance, etc) the use of Rds-sat as a precursor allows isolation of gate oxide degradation monitoring from package degradation which leads to rise in package related resistances.

When the SiC MOSFET device is fully on and conducting within the ohmic region, the drain-source resistance is much less than Rds-sat. In this region of operation, the channel resistance is comparable to package resistances. This implies, any change in package resistances due to aging will result in a measurable change in the device Rds-on. Therefore, in order to evaluate package related degradation, the SiC device should be fully conducting for Rds-on evaluation over its lifetime.

Figure 3:
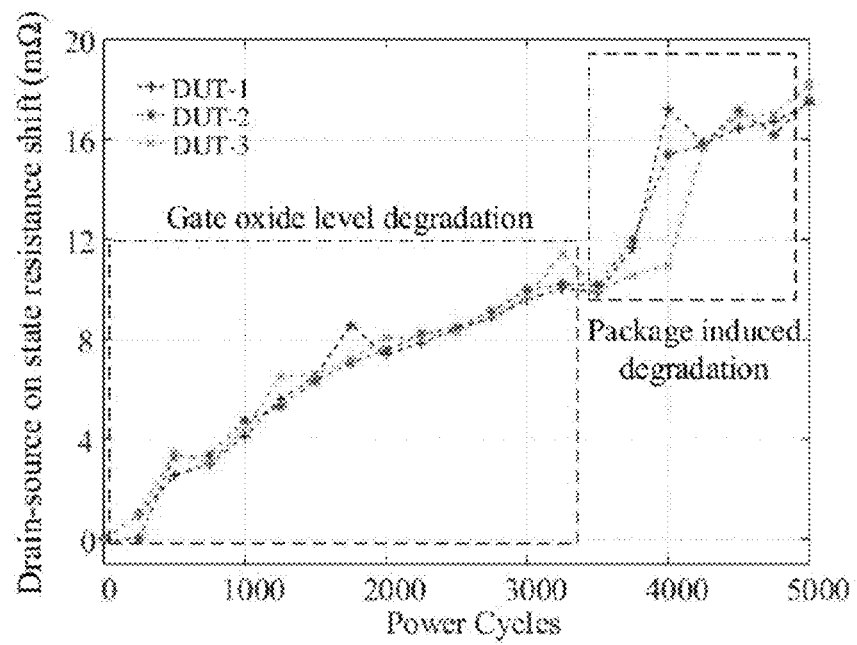
FIG. 3 is a graph illustrating Rds-on change over aging for the aged SiC devices measured by a curve tracer in some embodiments according to the invention.
Figure 4:
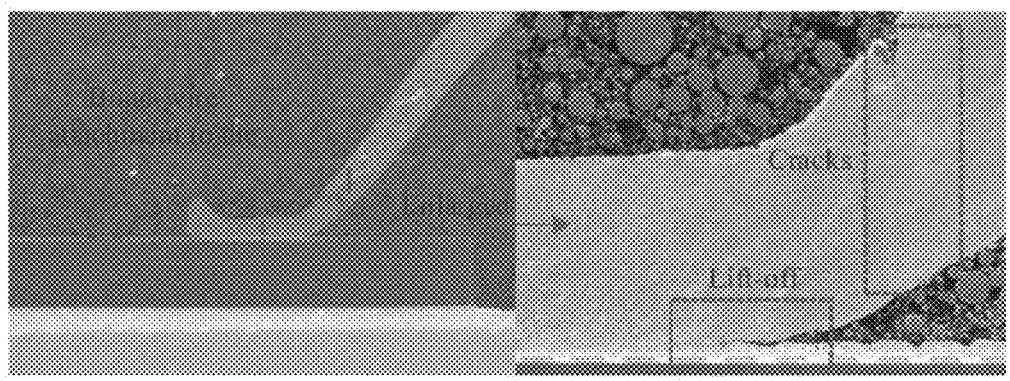
FIG. 4 is an SEM image of decapsulated DUT-1 after being subject to aging.

Rds-on change over aging for the aged SiC devices measured by curve tracer is depicted in FIG. 3. From Eq. 1, it is expected that device Vth shift will increase Rds-on. This is verified in FIG. 3 where the Rds-on of the devices increases gradually with aging. However, at 3500 cycles, an increase in the value of Rds for all three devices was observed. DUT-1 was decapsulated and device failure analysis was performed by scanning electron microscopy (SEM). As highlighted in FIG. 4, small cracks were observed in the bond-wire due to applied thermal swings. Also, a partial bond-wire lift-off from die attachment is also shown, which may account for the sudden increase in the Rds-on of the device due to a bond wire failing. Accordingly, FIG. 3 illustrates that, other than a Vth induced increase in Rds-on, a sudden positive shift in Rds-on may be attributed to package degradation. Therefore, using Rds-sat and Rds-on together as precursors can enable comprehensive degradation monitoring where both die and package related degradation can be tracked over a device's lifetime.

In the proposed monitoring method, both die and package related aging detection can be performed by running an in-situ diagnostic test at system start-up. The test is performed after the input DC voltage is applied and the DC bus capacitors are charged up but before the normal converter operation begins. The test may delay startup by several milliseconds, however, the exact time taken may depend on switch capacitance, power loop inductance and the bandwidth of the measurement circuit. In some embodiments according to the invention, the test may be performed in two steps: 1) Rds-sat of the devices is measured and 2) Rds-on is calculated. Further, it will be understood that in some embodiments, the Rds-sat for the first device and Rds-on for the second device may be measured simultaneously in 1) whereas in 2) Rds-on may be measured for the first device and Rds-sat may be measured for the second device simultaneously. This approach takes advantage of the fact that when one device is being tested for on of the precursors, the other device operates in the other mode of operation (in support of the test) which can be used to collect a measurement for the other device simultaneously.

Figure 5:
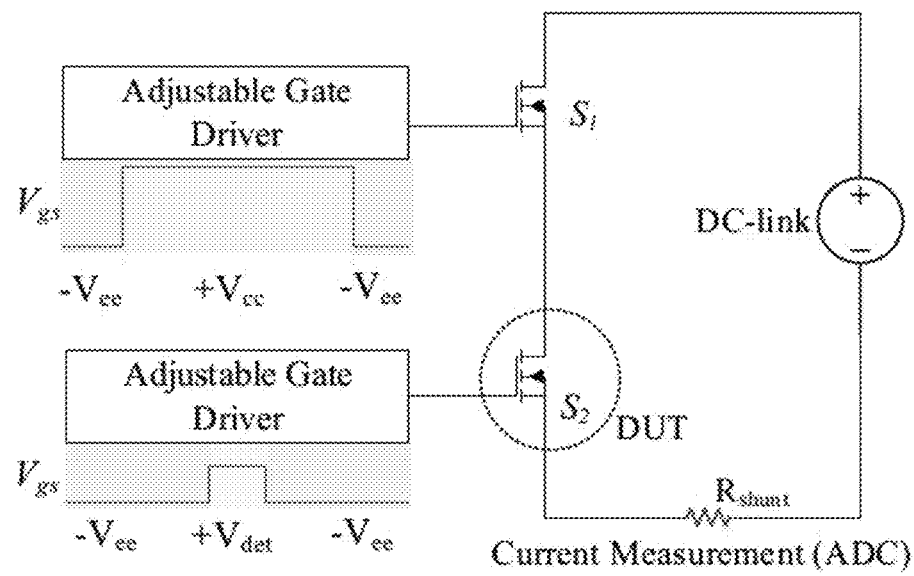
FIG. 5 is a schematic illustration of an in-situ circuit for Rds-sat measurement used to monitor gate oxide degradation in SiC MOSFETs of a converter in some embodiments according to the invention.

FIG. 5 is a schematic illustration of an in-situ circuit for Rds-sat measurement used to monitor gate oxide degradation in SiC MOSFETs of a converter in some embodiments according to the invention. According to FIG. 5, Vdet is the low positive bias applied to the gate for saturation mode conduction. −Vee (−5V) is the turn-off state Vgs, Vcc=20V is the turn-on state Vgs during fully-on mode. For Rds-sat measurement, the applied DC bus voltage is used to inject current through the MOSFETs in a phase-leg while all the other legs in the converter, if any, are kept off. Device S1 is turned on at the full gate voltage such that the device's channel is fully on and the DUT, shown as S2, is turned on for a short duration in saturation mode under low gate voltage Vdet. During this interval, although the devices in the same leg are turned-on simultaneously, the current in the leg is limited to a safe value since Rds-sat of the DUT is relatively high.

Given that the on-state resistance of the devices operating in saturation mode is much higher than the fully on device, it is assumed that the resistance of the leg is almost equal to the Rds-sat of the DUT. The current through the leg can be measured by using the system current sensor, represented by Rshunt in FIG. 5. The voltage across the leg is measured using the system DC link voltage sensor. By dividing the obtained voltage and current values from the same instance, the Rds-sat of the DUT is calculated. The use of system current and DC link voltage sensors, which are readily available in most converter systems, eliminates the need for additional sensors for Rds-sat measurement. The above process may be repeated with S1 acting as the DUT and S2 being turned on at full gate voltage. Moreover, as described above, in some embodiments, when S2 is being evaluated, S1 is fully-on, which may allow Rds-on for S1 to be estimated simultaneously using the same calculation.

The process may be repeated for every leg to obtain Rds-sat of each switch. For systems with variable bus voltages, the measured Vbus is associated with calculated Rds-sat for each device. Therefore, Vbus and Rds-sat look up table can be used to compensate the voltage impact on Rds-sat measurement accuracy.

Figure 6:
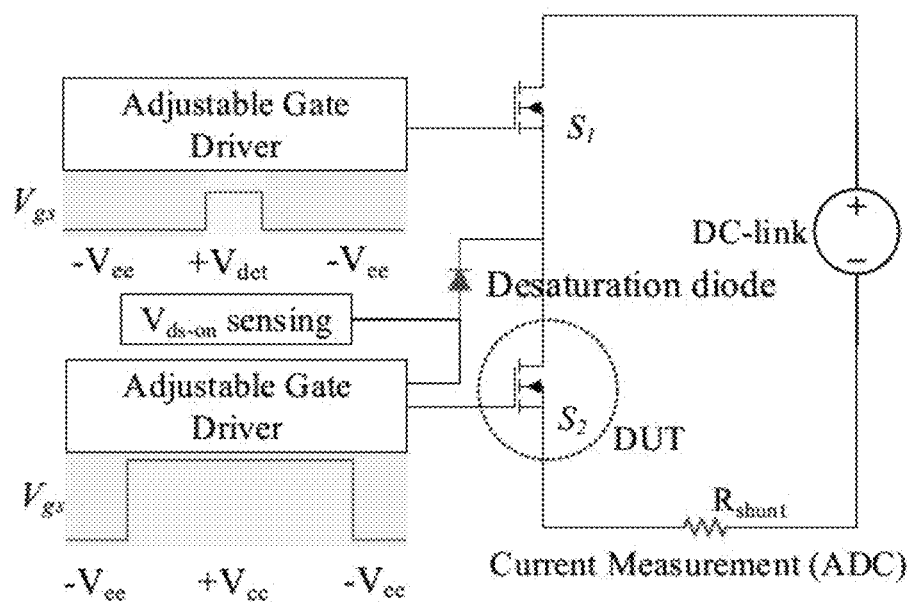
FIG. 6 is a schematic illustration of a circuit for Rds-on measurement which is used to monitor package related degradation in the devices in some embodiments according to the invention.

FIG. 6 depicts the schematic of the circuit for Rds-on measurement which is used to monitor package related degradation in the devices. Vdet' stands for the gate bias applied to the complementary switch during Rds-on detection stage. −Vee and Vcc have the same values as described above. For Rds-on calculation, first, DUT S2 is turned on at +Vcc such that its channel is fully conducting. Then a gate pulse of Vdet' is applied to switch S1 such that it turns on in saturation mode. S1 operates in saturation mode to ensure that the current in the phase-leg is limited and both the switches operate within their safe operating area (SOA). The Rds-on of the switch is calculated by sensing the Vds-on across the DUT and dividing it by the current value obtained from the system current sensor.

Figure 7:
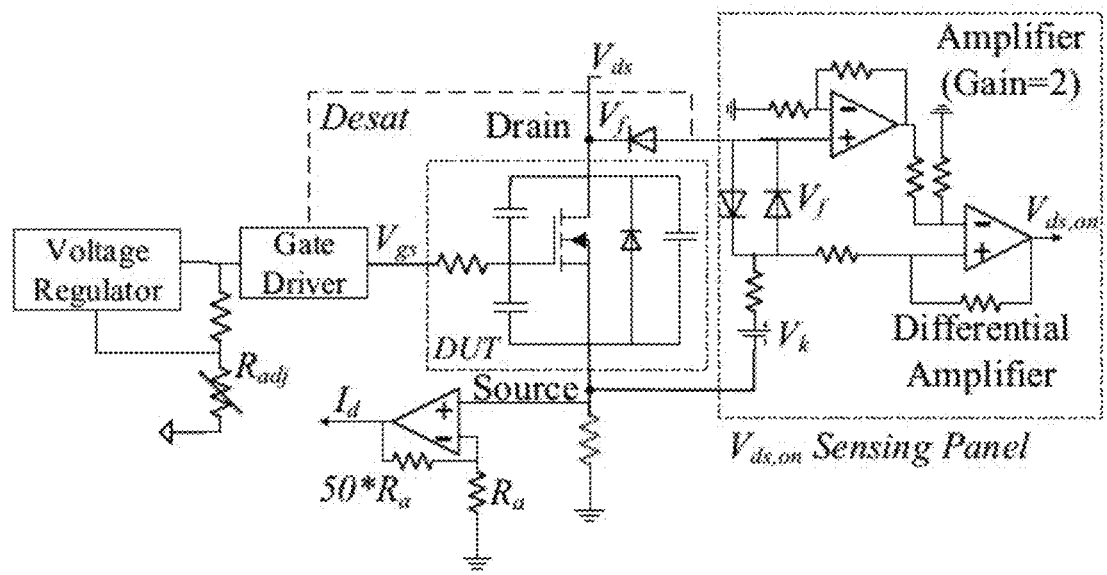
FIG. 7 is a schematic illustration of a Vds-on sensing circuit used with the circuits of FIGS. 5 and 6 in some embodiments according to the invention.

The schematic of the Vds-on sensing circuit used in FIGS. 5 and 6 is shown in FIG. 7. According to FIG. 7, the circuit uses a combination of amplifiers to directly output the device Vds-on. The desaturation diode used in gate driver short circuit protection circuit itself is used as the high voltage blocking diode when the switch is turned off. From FIG. 7 it is seen that when the DUT is turned on, the non-inverting input to the differential amplifier is at $2_{Vf+Vds-on}$. The inverting input is fed by a doubling amplifier whose output is equal to $2Vf_{+2vds-on}$. Hence, the differential amplifier output is equal to the conduction voltage drop across the DUT. It should be noted that DUT (S2) is turned on first and turned off later to ensure that its switch capacitance is completely discharged before current passes through it. This can avoid potential high voltage ringing across the switch capacitance due to interaction with parasitic inductance present in the power loop. The process is repeated with S1 acting as DUT and S2 being turned on in saturation region. Similarly, it is repeated for each leg to obtain the Rds-on value of each of the switches.

Figure 8:
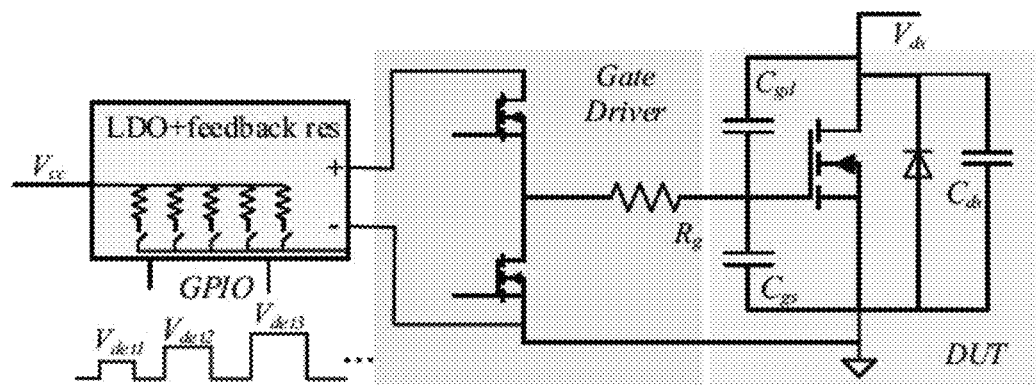
FIG. 8 is a schematic illustration of an on-board adjustable gate driver implementation used to vary the applied gate voltage for both aging detection (Vdet, Vdet') and normal operation (Vcc) on-board in some embodiments according to the invention.

FIG. 8 is a schematic illustration of an on-board adjustable gate driver implementation used to vary the applied gate voltage for both aging detection (Vdet,Vdet') and normal operation (Vcc) on-board in some embodiments according to the invention. According to FIG. 8 the gate driver is powered up by an adjustable LDO regulator. The output of LDO regulator is actively tuned through a digital potentiometer which is controlled by system DSP's GPIO. The applied gate voltages (Vdet,Vdet'), injected current pulse magnitude and duration, gate resistances are the variables which influence the effectiveness of the proposed degradation monitoring method. Hence, in this study, a systematic discussion on the choice of these variables is presented. The effect of the variables is characterized through a single pulse test setup. The single pulse test is conducted with two switches S1 and S2 serially connected across a 300V DC link in a phase-leg configuration similar to that shown in FIG. 5. For the test, only one of the switches (S2) has an adjustable gate driver and is designated as the DUT. S1 has a normal gate driver with full voltage swing (Vcc=+20V and Vee=−5V).

To actively vary the applied gate voltage to S2, an adjustable voltage regulator's output is used as the gate driver power supply. The voltage regulator has a potentiometer feedback to adjust the gate voltage as depicted in FIG. 7. A shunt resistor (Rshunt) is used for DUT drain current measurement in test setup. During the test, the DUT is turned on at low gate voltage such that it operates in saturation mode and S1 is turned on completely at full gate voltage. The DUT is characterized for various combinations of the test variables like DUT gate voltage level, current magnitude, leg turn on duration and gate resistance. Based on the tests, the factors influencing the choice of these parameters are discussed below.

Gate Bias for Aging Detection (Vdet)

Figure 9:
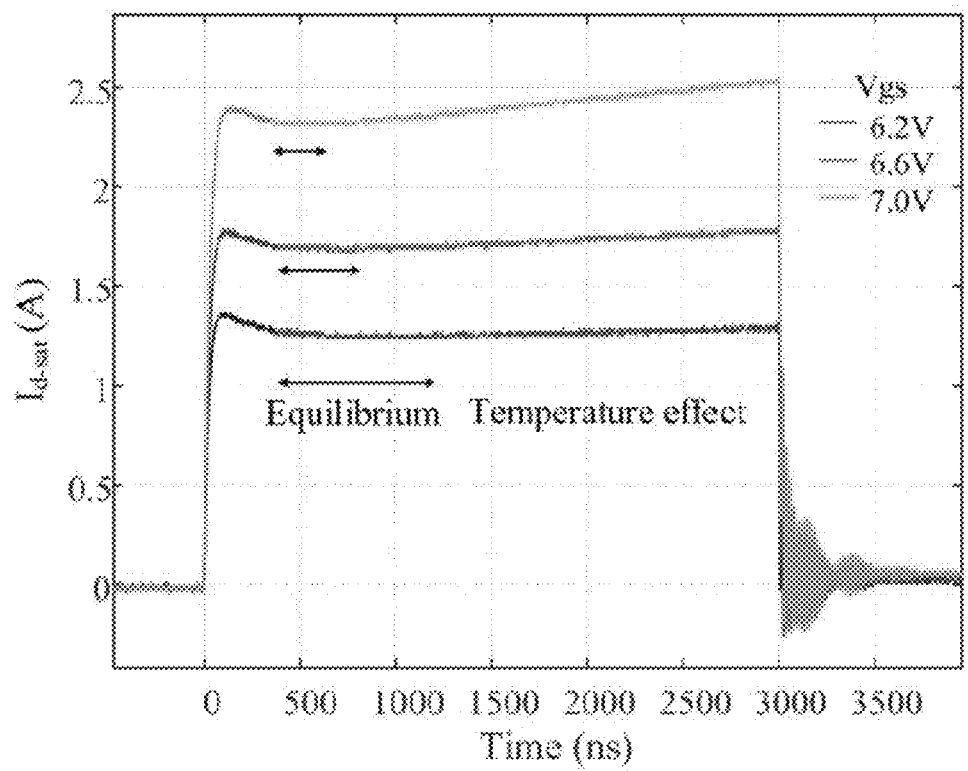
FIG. 9 is a graph showing the injected Id-sat waveforms at different Vdet for a healthy DUT in some embodiments according to the invention.

FIG. 9 shows the injected Id-sat waveforms at different Vdet for a healthy DUT. As shown in FIG. 9, higher drain current is injected at higher Vdet. Further three intervals can be observed during device conduction. As soon as Vdet is applied to the device gate, drain current rises. However, due to resonance between device lead inductance, circuit stray inductance and device capacitance, a current overshoot can be observed which is subsequently damped by the relatively high Rds-sat. This transient interval is about 300 ns for different Vdet as shown in FIG. 9. Following this transient interval, DUT reaches equilibrium state. In this interval, Id remains almost constant. The Ids-sat through the DUT is measured during this equilibrium interval from which Rds-sat is calculated. However, due to the high Vds across the device and injected Id-sat, there is significant device conduction power loss which causes a rise in the DUT junction temperature. Further, the threshold voltage of a SiC MOSFET is inversely proportional to its junction temperature. Hence, with higher T3, Id is expected to be higher for the same Vdet. This positive feedback effect is shown in FIG. 9 as an increasing Id-sat value in the third interval as the device T3 increases due to self-heating, which indicates that the equilibrium interval shortens as Vdet increases due to early onset of device heating due to increased power loss.

Figure 10:
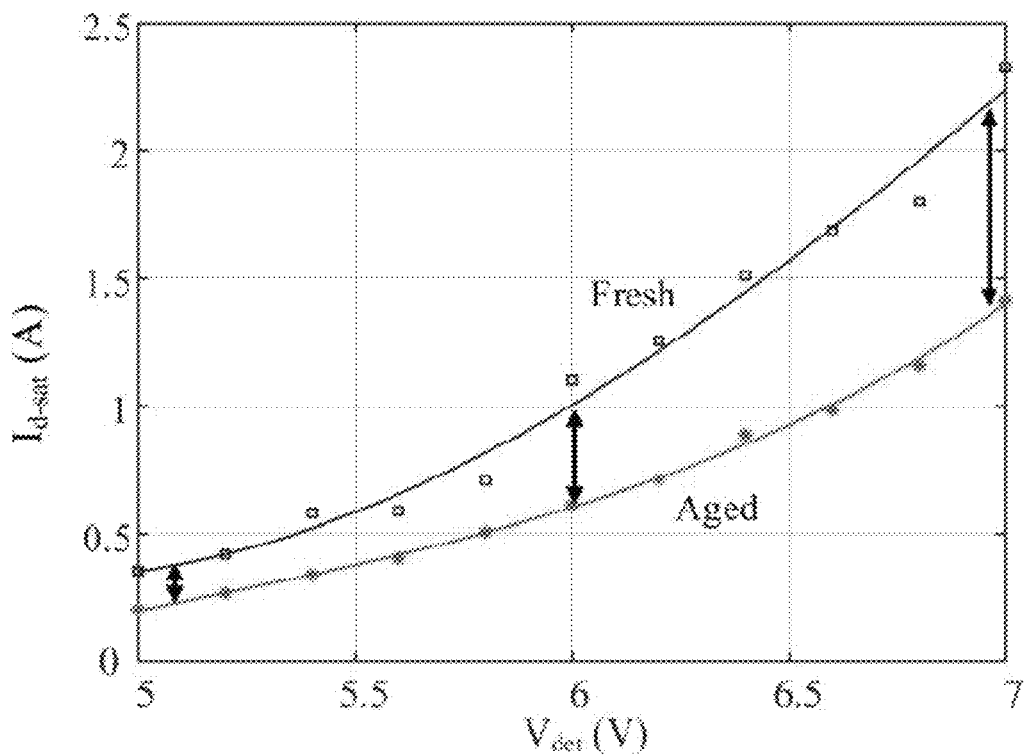
FIG. 10 is a graph showing the measured DUT Id-sat is plotted against Vdet varying from 5V to 7V for a healthy and aged device in some embodiments according to the invention.

As discussed above, with aging, the electro-thermal stresses on the device reduce the ability of the gate to form the inversion layer for on state current conduction. Hence, for the same Vdet, Id-sat is expected to decrease with device aging. In FIG. 10, the measured DUT Id-sat is plotted against Vdet varying from 5V to 7V for a healthy and aged device. As shown in FIG. 10 when higher Vdet is applied, larger Id-sat difference can be observed. When Vdet=5V, only 200 mA decrement is reported. Whereas Id-sat decreases by 1 A at Vdet=7V.

In view of the above, testing at higher Vdet can lead to higher Id-sat which in turn results in greater accuracy in the calculation of Rds-sat. Also, for a given measurement resolution, operation at higher Id-sat increases resolution of degradation monitoring due to a larger and observable shift in Id-sat over aging. At the same time, operating at high Vdet shortens the Id-sat equilibrium interval due to higher power loss hence reducing the available Id-sat measurement window. Therefore, the choice of Vdet for in-situ monitoring is a trade-off between measurement accuracy and available measurement window.

Applied Detection Pulse Duration ($T_p$)

Another variable that can influence the proposed degradation monitoring method is the duration of the applied Vdet. One constraint on the in-situ monitoring operation is that the switches should operate within the safe operating area (SOA) at all times. The SiC MOSFET devices tested were specified to safely conduct 10 A for 10 μs with a Vds of 800V. However, the voltage, current and pulse duration should be kept well below device limits to ensure that the degradation monitoring operation itself does not stress the device. Hence the Vdet pulse duration should be kept as short as possible. Other constraints are that Id-sat measurement should be made during the equilibrium interval to ensure measurement accuracy and the duration of the available equilibrium interval measurement window should be greater than the setup and hold times of the ADC used for Id-sat measurement.

External Gate Resistance (Rg)

Figure 11:
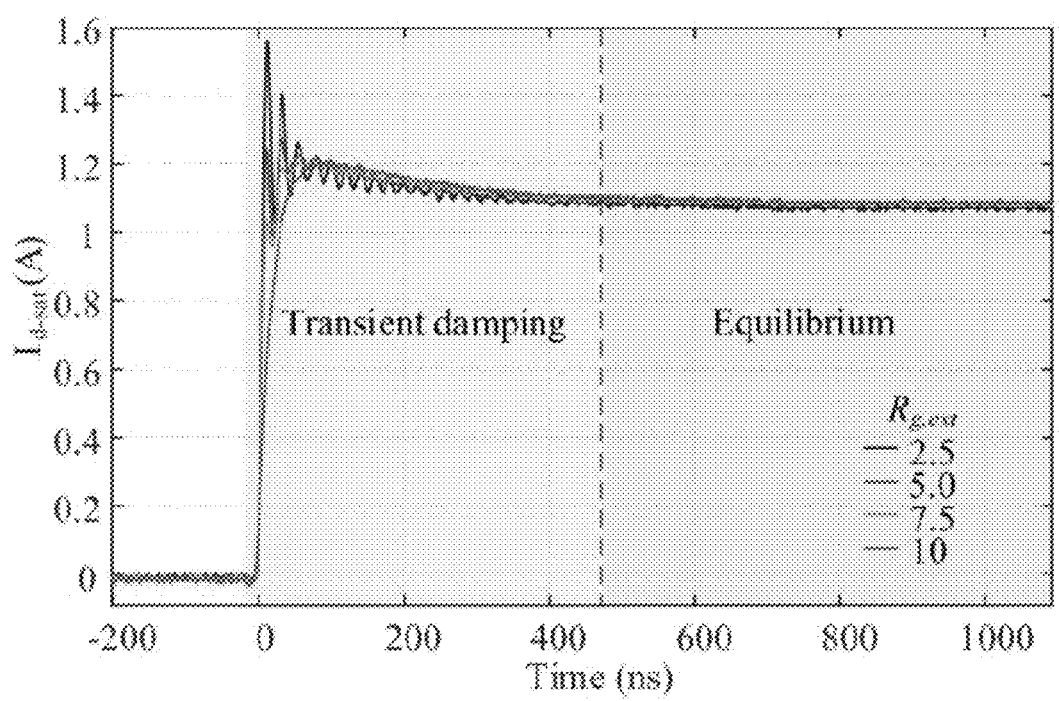
FIG. 11 is a graph showing Ids-sat waveforms for different values of gate resistances under same Vdet in some embodiments according to the invention.

As discussed above, a measurement made during the device turn on might not be reliably used for accurate Rds-sat calculation. Hence, the transient interval should be as short as possible to prevent its impact on detection accuracy and junction temperature of the DUT. In order to evaluate the external gate resistance's influence on the transient interval, $I_d$ waveforms were evaluated at turn-on for different values of external gate resistance (Rg-ext). FIG. 11 shows Ids-sat waveforms for different values of gate resistances under same Vdet. From FIG. 11, it is evident that there are two transient current components in the drain current waveform at turn on, namely a high frequency transient due to parasitics in the gate loop and the much slower power loop transient. The fast transients die out before the slow transient even for a value of Rg-ext as low as 2.5Ω. As seen here, higher values of Rg-ext lead to faster damping of the fast transients. The slower power loop transient damping duration is largely independent of the value of Rg-ext. Since the slow transient, which is largely independent of the Rg-ext, is the one affecting the measurement delay, the proposed condition monitoring method can be applied effectively even with a low value of Rg-ext. This implies the device turn on/off speed can be kept high therefore ensuring lower switching losses during the normal converter operation.

Applied Current for Id-Sat Measurement (Idet)

The constraints in choosing a suitable Idet for Rds-on measurement is the measurement accuracy and SOA operation of switch complementary to the DUT. Since, Rds-on is a relatively small value to measure, it is challenging to accurately measure it at low device currents. Hence, higher Idet can provide greater measurement accuracy for Rds-on. However, since the switch complementary to the DUT is operating in saturation region, it has significant power loss. It is important to ensure that this switch operates within its SOA at all times. In order to characterize the on-board Rds-on measurement circuit's accuracy, the measured Rds-on value from single pulse test circuit (Rds-circuit) is compared to curve tracer measurement (Rds-ref) in the Table shown in FIG. 12. According to FIG. 12, at low Id-sat (1 A), the deviation is around 0.89 mΩ. When larger Id-sat (2.5 A) is applied, the measurement error caused by detection circuit further reduces (<0.5 mΩ). Hence, if the complementary switch operated within SOA, Rds-on of the DUT can be effectively acquired.

Figure 13:
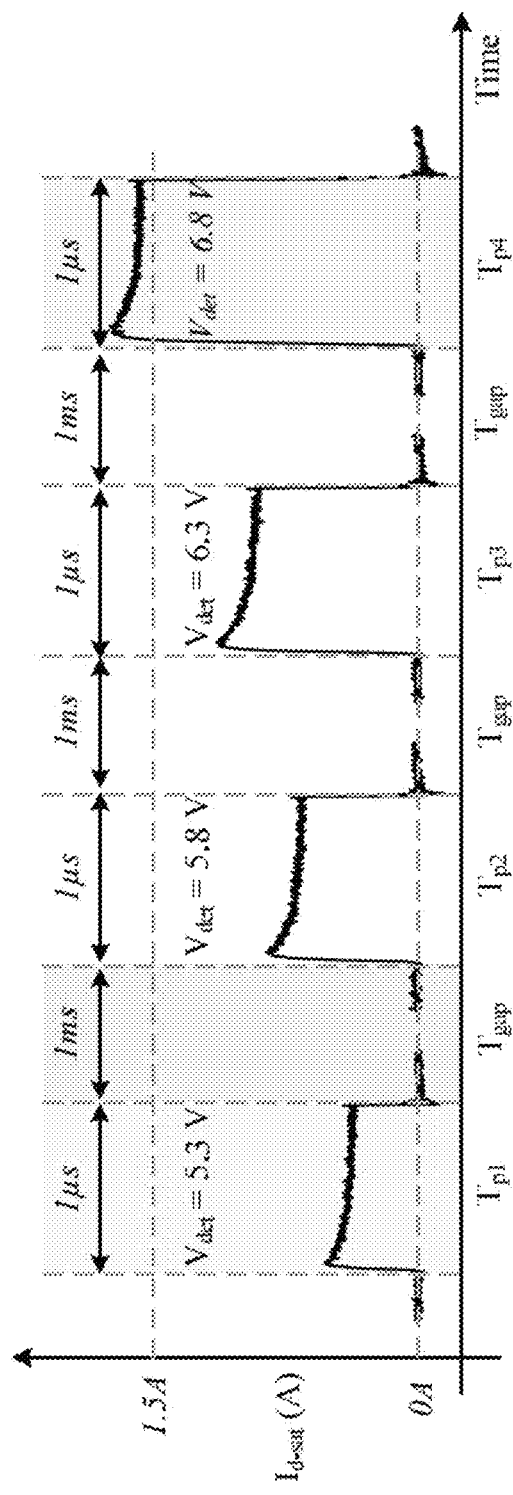
FIG. 13, is a graph showing consecutive gate pulses of increasing voltage magnitude are applied to the DUT the very first time system is started, while the other device in the phase-leg is kept fully on in some embodiments according to the invention.

As appreciated by the present inventors, a suitable value of Vdet should be selected such that Id-sat at that Vdet is large enough for accurate Rds-sat measurement and also ensure that the available equilibrium interval is long enough for the system ADC sampling. To sufficiently predict the value of injected Id-sat at certain Vdet, the Vdet necessary to achieve target Id-sat is calculated by the system the first time it is started. The determined Vdet is used throughout the life of the converter in monitoring the SiC devices. During this process, as shown in FIG. 13, consecutive gate pulses of increasing voltage magnitude are applied to the DUT the first-time system is started, while the other device in the phase-leg is kept fully on. The DUT current is measured during the application of each of the pulses and the gate voltage setting for which the DUT current first exceeds the target current is used as Vdet for DUT testing over its lifetime.

Figure 14:
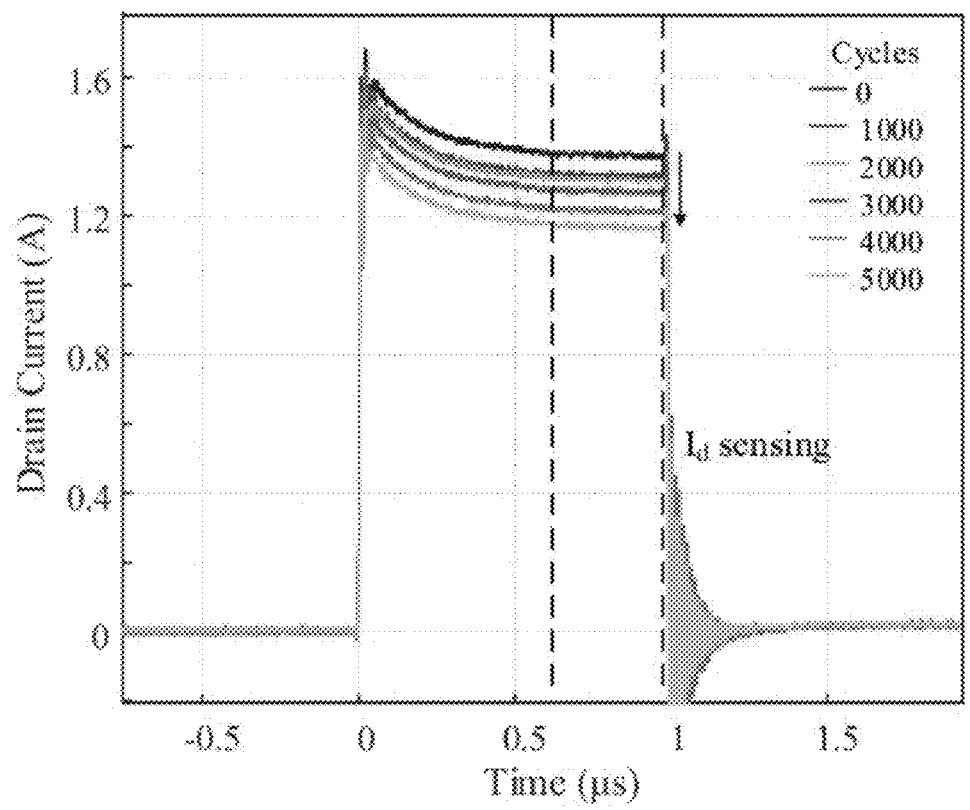
FIG. 14 is a graph showing a worst case transient interval of 500 ns observed for the SiC MOSFET tested in some embodiments according to the invention.

In this study, C2000 series DSP from Texas Instrument was used, the ADC of which needed 80 ns to acquire a voltage signal. Hence, an equilibrium interval of at least 100 ns was chosen for accurate Id-sat measurement. In FIG. 14, worst case transient interval of 500 ns is observed for the SiC MOSFET being tested. Therefore, a $T_p$ of 1, us was selected as the optimal pulse duration for accurate Id-sat measurement.

Based on single pulse tests of the device before and after aging shown in FIG. 10 and detected Rds-on data from Table in FIG. 12, a target current of 1.5 A was chosen for Rds-sat measurement as it offered sufficient measurement accuracy, high resolution of Rds-sat variation over aging and sufficiently long equilibrium interval of around 500 ns. As can be seen in FIG. 10, 1, us pulses followed by 1 ms rest period are applied to determine the Vdet. The gate voltage is incremented by 0.5V between pulses. The target current is reached at Vgs=6.8V and it therefore it is picked as the Vdet. Similarly, 2.5 A is selected to accurately monitor DUT's Rds-on over degradation.

As discussed above, the proposed method uses the system sensors to obtain current and voltage values. Therefore, to validate the SiC MOSFET degradation monitoring method in various power converter applications, experimental data for different circuit current sensing configurations was collected as described below.

Shunt Resistor in Phase-Leg

In phase-leg based power converters, shunt resistors are commonly employed for phase current measurement and are connected in series with power leg. For example, in some of the motor drive systems, separate shunt resistors are connected in series with the power switches on the low side of each phase-leg. Using the current shunt on the return path of phase leg eliminates need for current sensing isolation. For illustration, DUT-1's current pulses over aging are depicted in FIG. 14. From DUT's healthy state to 5000 aging cycles, a dramatic Id-sat decrement is observed. Specifically, 0.3 A total decrement in Id-sat is sensed by system current measurement unit. In the test setup, 0.02Ω shunt resistor is employed for current sensing. For the chosen current shunt value, a variation of 0.3 A in Id-sat over aging translates to a 6 mV change in voltage across the current shunt. This variation can be accurately measured as it is much larger than the 0.8 mV resolution of the used system ADC. The employed system ADC had a data conversion time of 80 ns, and the injected current pulse could be measured within a sufficient interval.

Figure 15:
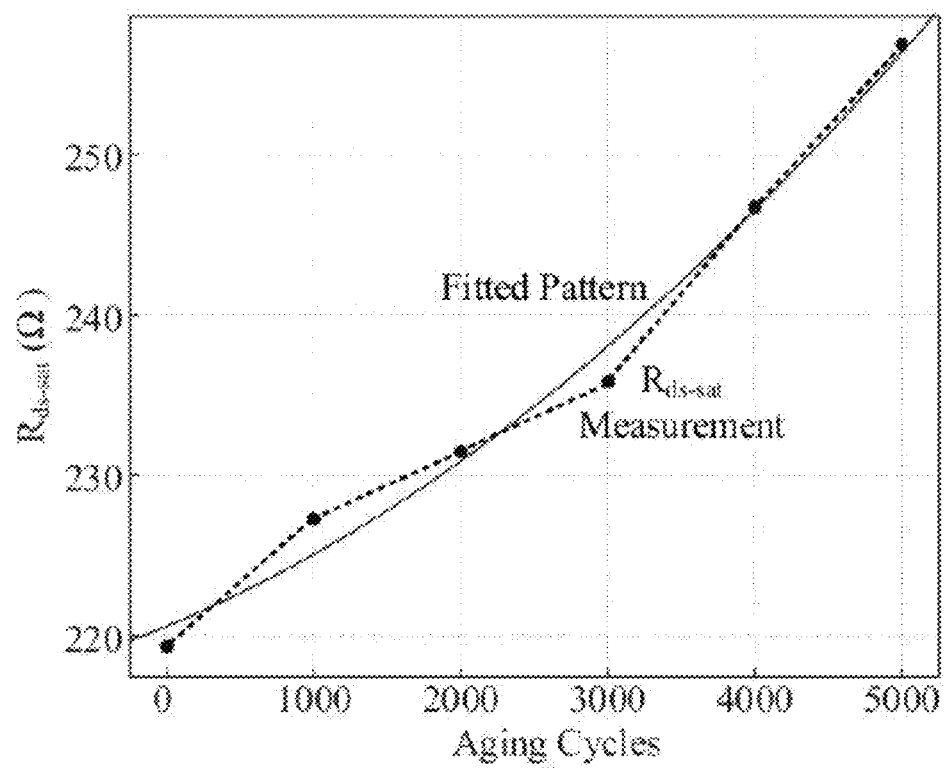
FIGS. 15 and 16 are plots showing measured Rds-sat and Rds-on, respectively throughout the DUT aging process in some embodiments according to the invention.
Figure 16:
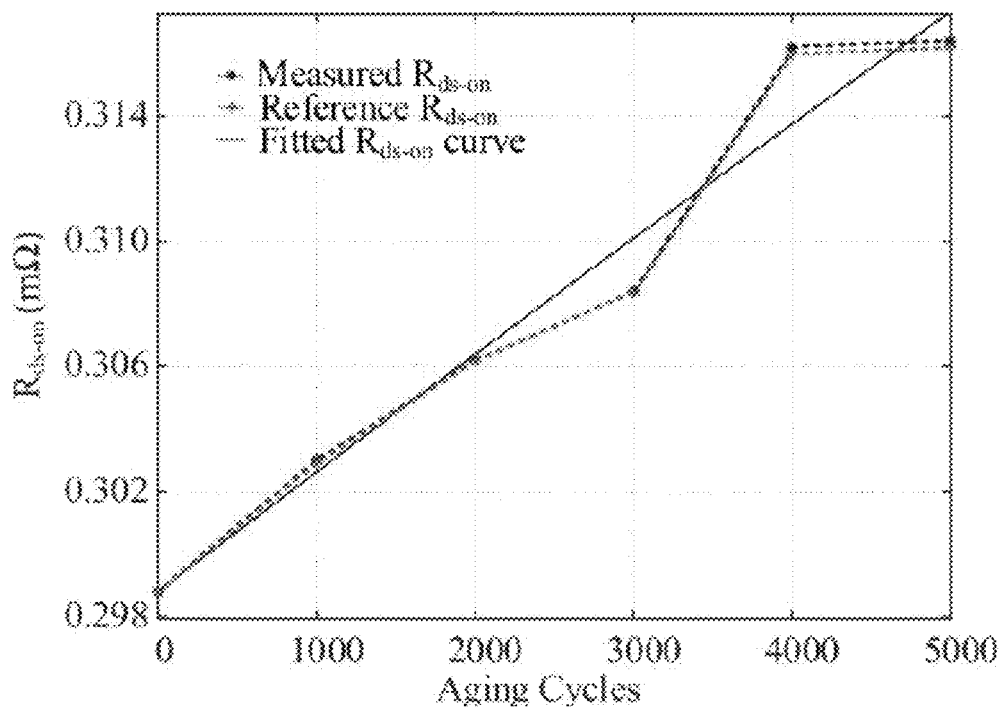

In FIGS. 15 and 16, measured Rds-sat and Rds-on are plotted throughout device's aging process. From 0 to 5000 cycles, Rds-sat increases by almost than 30Ω. This result matches with the measurement obtained using the curve tracer. The curve fitted to the obtained Rds-sat values over aging is depicted in blue Rds-sat shows monotonic increment with device aging over its lifetime. Similarly, measured Rds-on also increases throughout device aging. As shown in FIG. 16, the values of Rds-on obtained from on-board measurement circuit matches with the curve tracer measured reference values reported in FIG. 3. It is verified that DUT Rds-on change can be accurately monitored by proposed method when the current is sensed through shunt resistors.

Current Transducer with Inductive Load

Figure 17:
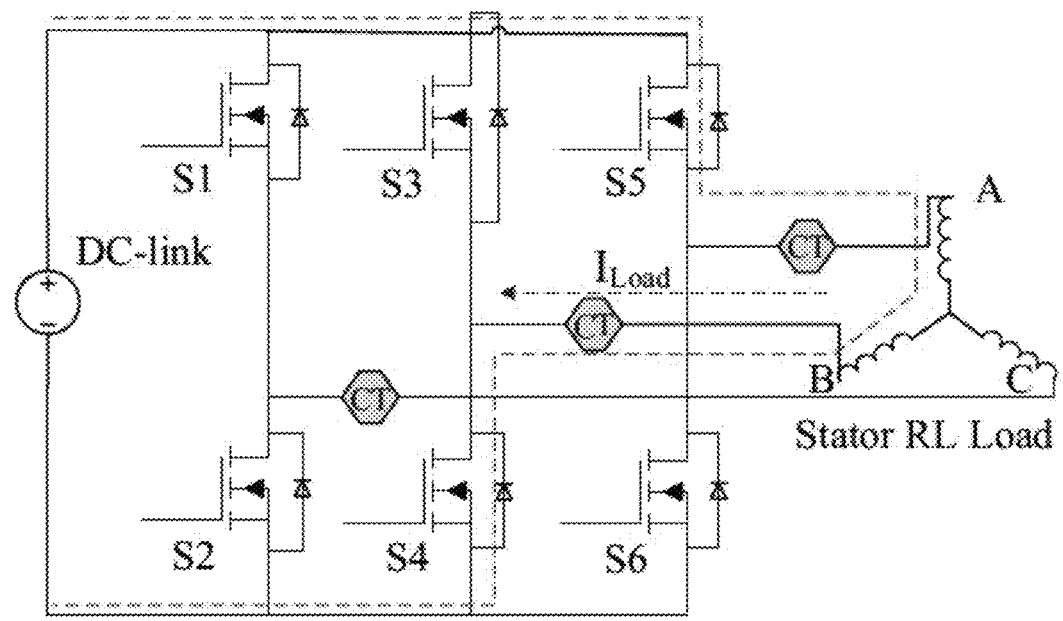
FIG. 17 is a circuit schematic illustrating a motor drive system with load side planted current sensors including SiC MOSFET devices monitored in some embodiments according to the invention.

In some cases, the system current sensor is connected in series with the phase outputs as illustrated in FIG. 17. In this case, the load inductance is in series with the current path and introduce challenges to current sensing. A similar situation is also seen in step-down converter, where the buck inductor exists in current measurement loop. In some embodiments, the presence of the inductor can impact the injected drain current during DUT condition monitoring stage.

Figure 18:
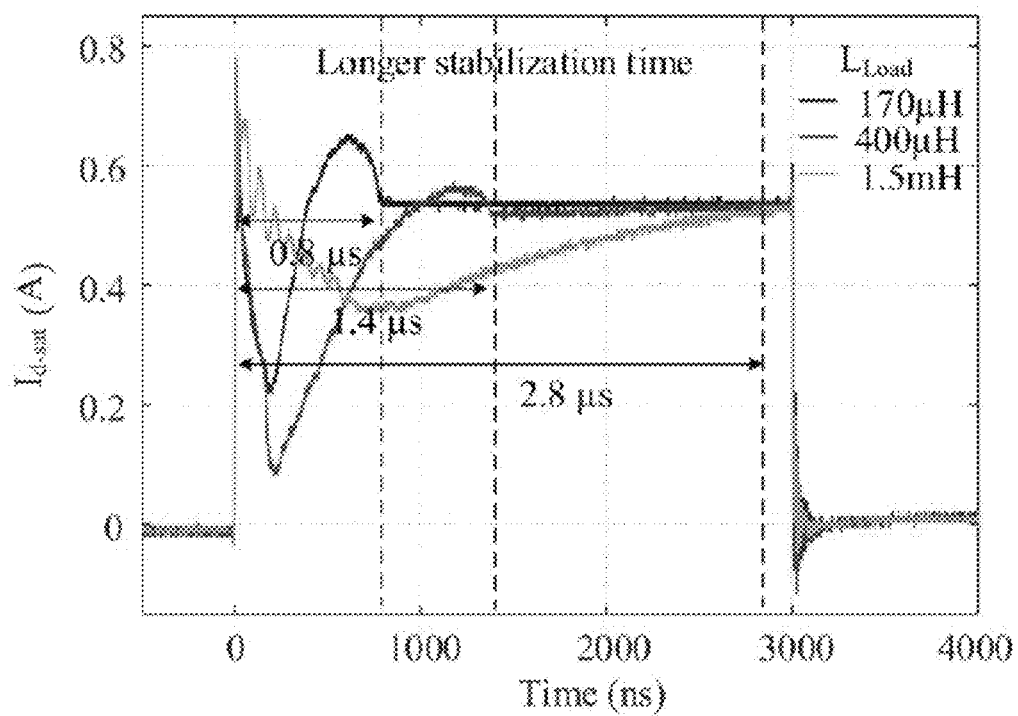
FIG. 18 is a graph showing measured Id-sat with different load conditions with inductance in the current measurement loop shown in FIG. 17 in some embodiments according to the invention.

Due to the presence of load inductance in system current path, power loop current is expected to rise gradually when Vdet is applied. This added current rise time would make the duration of the transient interval longer. This is illustrated in FIG. 18 where Id-sat pulses at Vdet=5.5V are shown for different values of load inductance when power loop across S4-S5 is selected for current injection and S4 is picked as DUT. As observed in FIG. 18, when gate voltage is applied, a current spike is initially generated. This is caused by S3's anti-parallel diode junction capacitance charging current during switching transient. After the upper diode is fully charged, current starts to flow through the load inductance. Theoretically, current rise time is positively impacted by load inductance. As shown in FIG. 18. the load inductor induces extra current rise time making the transient interval longer. For example, for a 170 µH Lload, the current settles in 0.8 µs, whereas it takes nearly 3 µs for the current to settle for a 1.5 mH Lload. Since a reliable Rds-sat value cannot be obtained during the transient interval, testing should be conducted at a lower Vdet to avoid temperature induced Ids-sat change during this interval and ensure DUT is accurately monitored at the equilibrium state of injected Id pulse. For systems with relatively low LLoad as shown in FIG. 18, it is acceptable if a low bandwidth current sensor (>300 kHz) is deployed in the system. However, for higher $L_{load}$ such as 1.5 mH, a 1 MHz bandwidth sensor is required to obtain quick current measurement to keep the injected $I_d$ within the self-heating allowance range.

Figure 19:
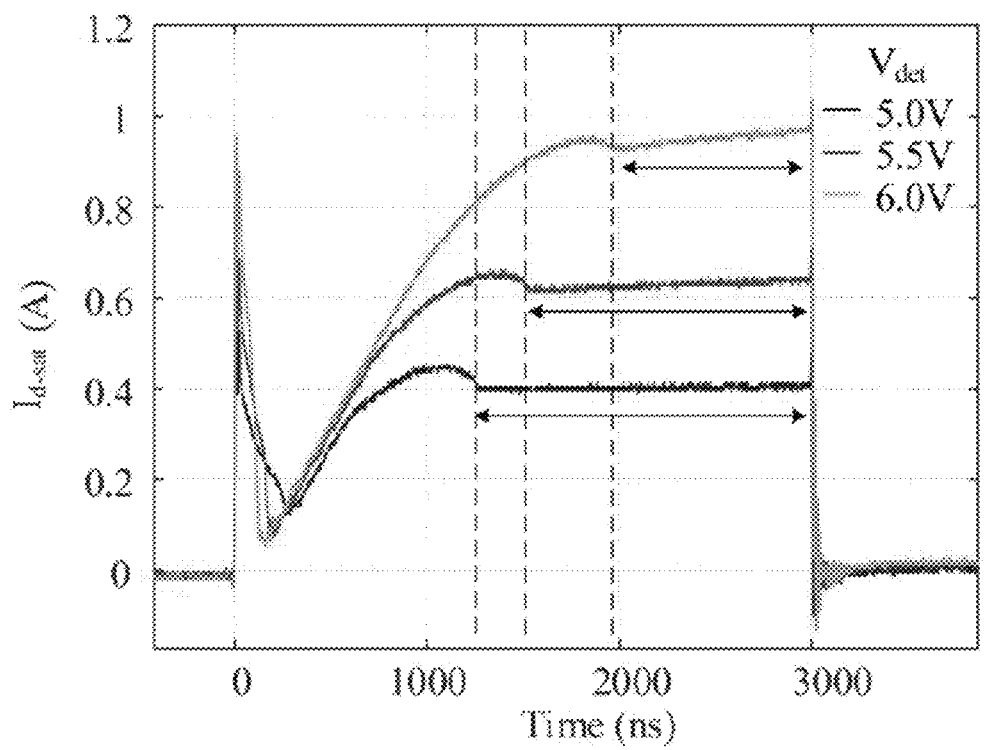
FIG. 19 is a graph showing measured Id-sat with different applied Vdet with inductance in the current measurement loop shown in FIG. 17 in some embodiments according to the invention.

In FIG. 19, $V_{det}$=5V, 5.5V and 6V were applied to the gate for the same $L_{Load}$ (400 µH). As can be seen in FIG. 19, the transient interval is lower at lower Vdet. Further, compared to the shunt resistor based current measurement method used in phase-leg configuration, the current transducers' sensing bandwidth is lower (=1 MHz). Hence, by applying a low Vdet, an Id pulse with adequate current sensing duration can be acquired, and Id-sat can be effectively captured. When Vdet=5V, the transient interval reduces to 1.25 µs from around 2 us for Vdet=6V. Therefore, instead of choosing the target Id-sat as 1.5 A for degradation monitoring, 0.5 A Id-sat is picked to determine the applied Vdet for aging detection. Consequently, $T_p$ for inductive load has been recalculated due to the additional current rise time. During this interval, the slope of the inductor current is described as:

$$L_{load}\frac{di_L}{dt} = V_{bus} - i_L + R_{ds-sat} \text{ where} \quad (2)$$

$$i_L = \frac{V_{bus}}{R_{ds-sat}}\left(1 - e^{-\frac{R_{ds-sat}}{L_{load}}T_p}\right) \quad (3)$$

Figure 20:
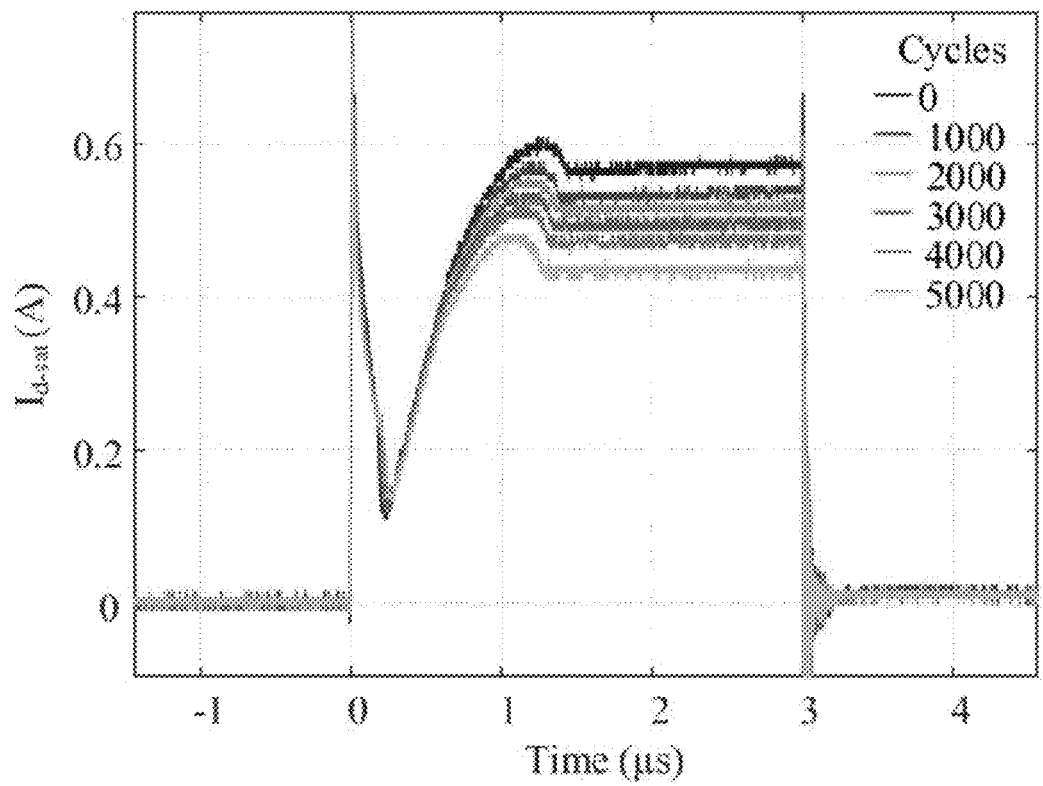
FIG. 20 is a graph showing on-board measured DUT-1 Id-sat pulses over aging derived using FIG. 17 in some embodiments according to the invention.
Figure 21:
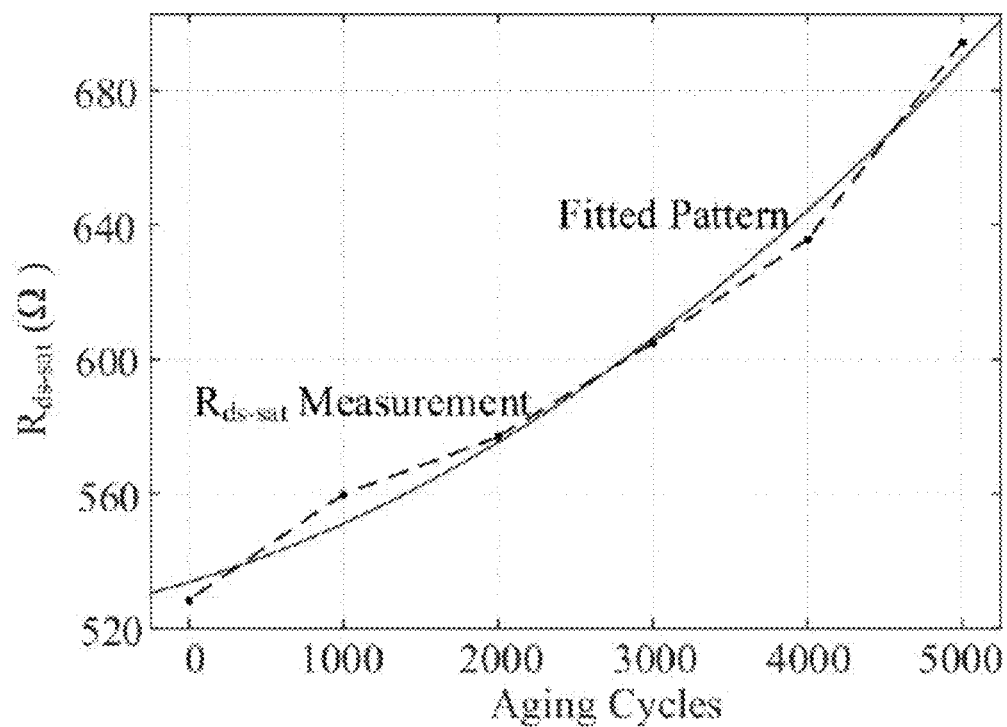
FIGS. 21 and 22 are graphs showing measured Rds-sat and Rds-on, respectively with inductive load over aging derived using FIG. 17 in some embodiments according to the invention.
Figure 22:
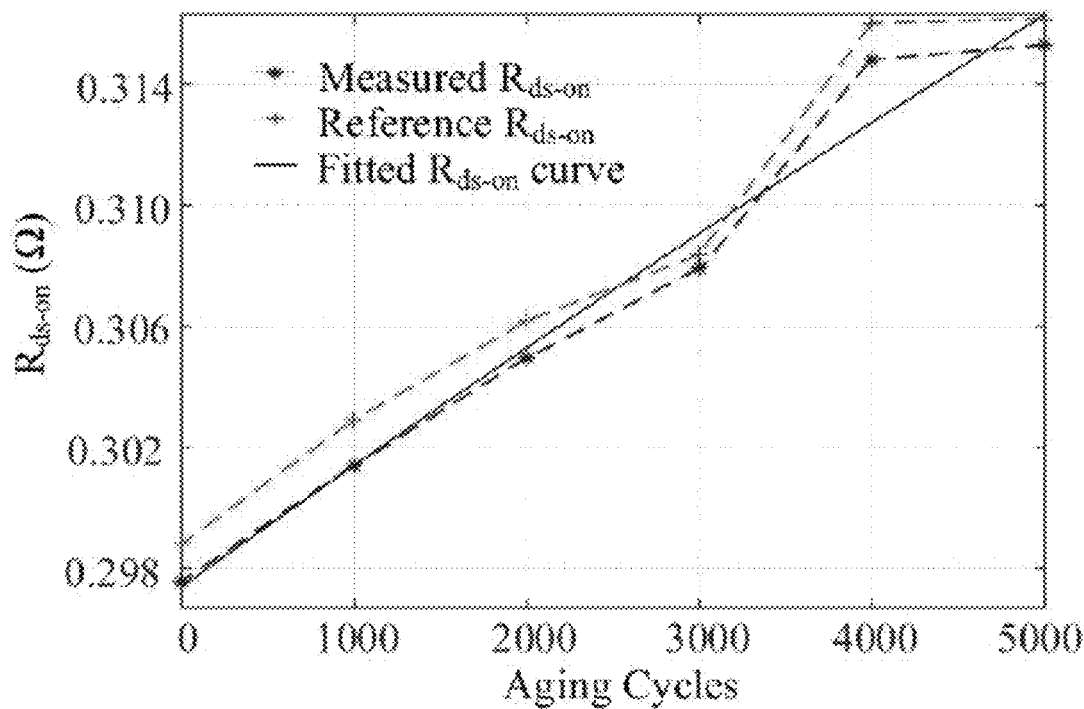

The Rds-sat is expected to be minimum when the device is brand new. Hence, if minimum Rds-sat is obtained in equation (3), the equilibrium state current is expected to reach an upper limit of 0.5 A. The applied current pulse duration $T_p$ can be determined by substituting minimum Rds-sat value into equation (3), which is equal to $V_{bus}$/0.5 A. Therefore, when Id-sat shifts negatively with the device degradation, the above calculated $T_p$ is more than adequate for Id-sat to stabilize itself for accurate measurement. For illustration, load inductance of 400 µH is substituted into equation (3) and a $T_p$=3.07 µs is obtained from calculation. The experimental result of the measured Id-sat shift with inductive load is depicted in FIG. 20. At 5000 cycles, a decrease of 0.3 A in the Id-sat is observed which is consistent with the single pulse test result. The 40 A hall sensor used here could accurately measure the 0.3 A shift in Id-sat over aging. Specifically, based on the evaluation result in FIG. 20, the current sensing unit should have at least 0.02 A sensitivity for aging assessment. For systems where the sensitivity of current sensor is too low to measure Id change during aging, a higher sensitivity current sensor can be used for aging detection. This sensor can operate in saturation mode during system normal operation. As shown in FIG. 21, the corresponding DUT's Rds-sat increases by 166.2852. Compared to case study I, the detected Rds-sat increment is more remarkable due to operation at lower gate voltage. However, Rds-on sensing accuracy is sacrificed as observed in FIG. 22 due to lower injected drain current. Compared to an 20m52 Rds-on shift, the induced Rds-on sensing error is negligible. Hence, as verified, for both the current sensing configurations, the observed Rds-sat and Rds-on shifts match the theoretical analysis results. In addition, according experimental results comparison between FIG. 14 and FIG. 20, current sensing unit on phase-leg can provide higher detection accuracy. Hence, if enough design margin exists, a phase-leg based current sensing may be preferable from aging detection aspect. Furthermore, reliable sensors with relatively high rated junction and storage temperature are also preferable for current measurement consistency over time.

Figure 23:
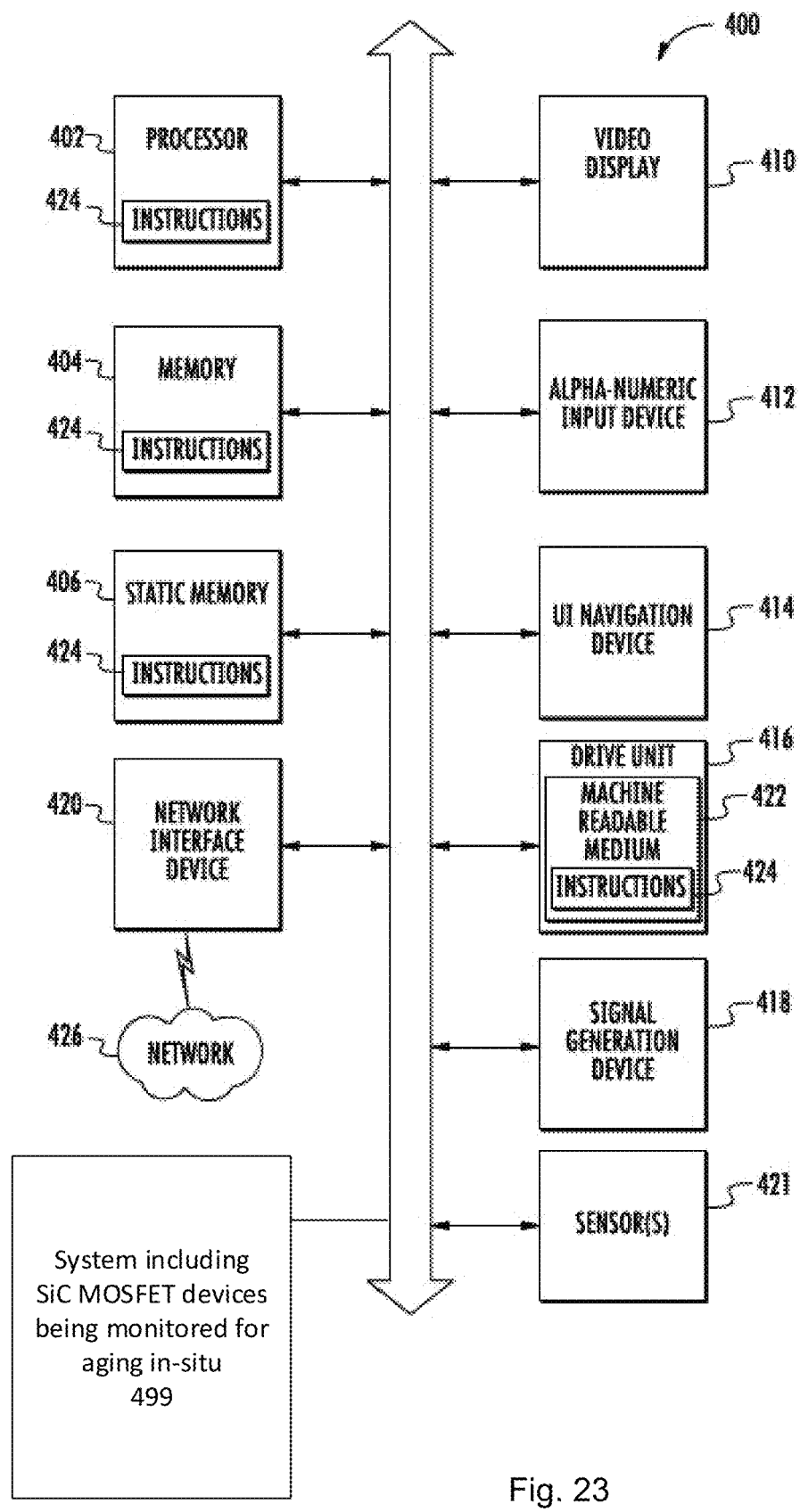
FIG. 23 is a block diagram of a computing system that can be used to perform processor-executable instructions represented by non-transitory processor-readable media to carry out the operations shown in FIGS. 1-9 in some embodiments according to the invention.

FIG. 23 is a block diagram illustrating an example of a machine upon which one or more aspects of embodiments of the present invention can be implemented. For example the block diagram of FIG. 23 illustrates a computing system that can be used to perform processor-executable instructions represented by non-transitory processor-readable media to carry out the operations shown in some of the embodiments according to the invention. An aspect of an embodiment of the present invention includes, but not limited thereto, a system 499 includes SiC MOSFET devices to be monitored in-situ for aging related indicators such as increases in Rds-sat and Rds-on as indications of packaging related (i.e., contact degradation) aging and die (i.e., gate oxide degradation) aging over time. According, at power up (before application-oriented operations begin) a diagnostic routine can be executed to operate the devices in-situ in the system 499 to collect Rds-sat and Rds-on data. The data can be collected at each power-up, which can be compiled (for example by the machine 400) to ascertain the device condition due to aging before an actual failure occurs.

Examples of machine 400 can include logic, one or more components, circuits (e.g., modules), or mechanisms. Circuits are tangible entities configured to perform certain operations. In an example, circuits can be arranged (e.g., internally or with respect to external entities such as other circuits) in a specified manner. In an example, one or more computer systems (e.g., a standalone, client or server computer system) or one or more hardware processors (processors) can be configured by software (e.g., instructions, an application portion, or an application) as a circuit that operates to perform certain operations as described herein. In an example, the software can reside (1) on a non-transitory machine readable medium or (2) in a transmission signal. In an example, the software, when executed by the underlying hardware of the circuit, causes the circuit to perform the certain operations.

In an example, a circuit can be implemented mechanically or electronically. For example, a circuit can comprise dedicated circuitry or logic that is specifically configured to perform one or more techniques such as discussed above, such as including a special-purpose processor, a field programmable gate array (FPGA) or an application-specific integrated circuit (ASIC). In an example, a circuit can comprise programmable logic (e.g., circuitry, as encompassed within a general-purpose processor or other programmable processor) that can be temporarily configured (e.g., by software) to perform the certain operations. It will be appreciated that the decision to implement a circuit mechanically (e.g., in dedicated and permanently configured circuitry), or in temporarily configured circuitry (e.g., configured by software) can be driven by cost and time considerations.

Accordingly, the term "circuit" is understood to encompass a tangible entity, be that an entity that is physically constructed, permanently configured (e.g., hardwired), or temporarily (e.g., transitorily) configured (e.g., programmed) to operate in a specified manner or to perform specified operations. In an example, given a plurality of temporarily configured circuits, each of the circuits need not be configured or instantiated at any one instance in time. For example, where the circuits comprise a general-purpose processor configured via software, the general-purpose processor can be configured as respective different circuits at different times. Software can accordingly configure a processor, for example, to constitute a particular circuit at one instance of time and to constitute a different circuit at a different instance of time.

In an example, circuits can provide information to, and receive information from, other circuits. In this example, the circuits can be regarded as being communicatively coupled to one or more other circuits. Where multiple of such circuits exist contemporaneously, communications can be achieved through signal transmission (e.g., over appropriate circuits and buses) that connect the circuits. In embodiments in which multiple circuits are configured or instantiated at different times, communications between such circuits can be achieved, for example, through the storage and retrieval of information in memory structures to which the multiple circuits have access. For example, one circuit can perform an operation and store the output of that operation in a memory device to which it is communicatively coupled. A further circuit can then, later, access the memory device to retrieve and process the stored output. In an example, circuits can be configured to initiate or receive communications with input or output devices and can operate on a resource (e.g., a collection of information).

The various operations of method examples described herein can be performed, at least partially, by one or more processors that are temporarily configured (e.g., by software) or permanently configured to perform the relevant operations. Whether temporarily or permanently configured, such processors can constitute processor-implemented circuits that operate to perform one or more operations or functions. In an example, the circuits referred to herein can comprise processor-implemented circuits.

Similarly, the methods described herein can be at least partially processor implemented. For example, at least some of the operations of a method can be performed by one or processors or processor-implemented circuits. The performance of certain of the operations can be distributed among the one or more processors, not only residing within a single machine, but deployed across a number of machines. In an example, the processor or processors can be in a single location (e.g., within a home environment, an office environment or as a server farm), while in other examples the processors can be distributed across several locations.

The one or more processors can also operate to support performance of the relevant operations in a "cloud computing" environment or as a "software as a service" (SaaS). For example, at least some of the operations can be performed by a group of computers (as examples of machines including processors), with these operations being accessible via a network (e.g., the Internet) and via one or more appropriate interfaces (e.g., Application Program Interfaces (APIs).)

Example embodiments (e.g., apparatus, systems, or methods) can be implemented in digital electronic circuitry, in computer hardware, in firmware, in software, or in any combination thereof. Example embodiments can be implemented using a computer program product (e.g., a computer program, tangibly embodied in an information carrier or in a machine readable medium, for execution by, or to control the operation of, data processing apparatus such as a programmable processor, a computer, or multiple computers).

A computer program can be written in any form of programming language, including compiled or interpreted languages, and it can be deployed in any form, including as a stand-alone program or as a software module, subroutine, or other unit suitable for use in a computing environment. A computer program can be deployed to be executed on one computer or on multiple computers at one site or distributed across multiple sites and interconnected by a communication network.

In an example, operations can be performed by one or more programmable processors executing a computer program to perform functions by operating on input data and generating output. Examples of method operations can also be performed by, and example apparatus can be implemented as, special purpose logic circuitry (e.g., a field programmable gate array (FPGA) or an application-specific integrated circuit (ASIC)).

The computing system can include clients and servers. A client and server are generally remote from each other and generally interact through a communication network. The relationship of client and server arises by virtue of computer programs running on the respective computers and having a client-server relationship to each other. In embodiments deploying a programmable computing system, it will be appreciated that both hardware and software architectures require consideration. Specifically, it will be appreciated that the choice of whether to implement certain functionality in permanently configured hardware (e.g., an ASIC), in temporarily configured hardware (e.g., a combination of software and a programmable processor), or a combination of permanently and temporarily configured hardware can be a design choice. Below are set out hardware (e.g., machine 400) and software architectures that can be deployed in example embodiments. In an example, the machine 400 can operate as a standalone device or the machine 400 can be connected (e.g., networked) to other machines.

In a networked deployment, the machine 400 can operate in the capacity of either a server or a client machine in server-client network environments. In an example, machine 400 can act as a peer machine in peer-to-peer (or other distributed) network environments. The machine 400 can be a personal computer (PC), a tablet PC, a set-top box (STB), a Personal Digital Assistant (PDA), a mobile telephone, a web appliance, a network router, switch or bridge, or any machine capable of executing instructions (sequential or otherwise) specifying actions to be taken (e.g., performed) by the machine 400. Further, while only a single machine 400 is illustrated, the term "machine" shall also be taken to include any collection of machines that individually or jointly execute a set (or multiple sets) of instructions to perform any one or more of the methodologies discussed herein.

Example machine (e.g., computer system) 400 can include a processor 402 (e.g., a central processing unit (CPU), a graphics processing unit (GPU) or both), a main memory 404 and a static memory 406, some or all of which can communicate with each other via a bus 408. The machine 400 can further include a display unit 410, an alphanumeric input device 412 (e.g., a keyboard), and a user interface (UI) navigation device 411 (e.g., a mouse). In an example, the display unit 810, input device 417 and UI navigation device 414 can be a touch screen display. The machine 400 can additionally include a storage device (e.g., drive unit) 416, a signal generation device 418 (e.g., a speaker), a network interface device 420, and one or more sensors 421, such as a global positioning system (GPS) sensor, compass, accelerometer, or other sensor.

The storage device 416 can include a machine readable medium 422 on which is stored one or more sets of data structures or instructions 424 (e.g., software) embodying or utilized by any one or more of the methodologies or functions described herein. The instructions 424 can also reside, completely or at least partially, within the main memory 404, within static memory 406, or within the processor 402 during execution thereof by the machine 400. In an example, one or any combination of the processor 402, the main memory 404, the static memory 406, or the storage device 416 can constitute machine readable media.

While the machine readable medium 422 is illustrated as a single medium, the term "machine readable medium" can include a single medium or multiple media (e.g., a centralized or distributed database, and/or associated caches and servers) that configured to store the one or more instructions 424. The term "machine readable medium" can also be taken to include any tangible medium that is capable of storing, encoding, or carrying instructions for execution by the machine and that cause the machine to perform any one or more of the methodologies of the present disclosure or that is capable of storing, encoding or carrying data structures utilized by or associated with such instructions. The term "machine readable medium" can accordingly be taken to include, but not be limited to, solid-state memories, and optical and magnetic media. Specific examples of machine readable media can include non-volatile memory, including, by way of example, semiconductor memory devices (e.g., Electrically Programmable Read-Only Memory (EPROM), Electrically Erasable Programmable Read-Only Memory (EEPROM)) and flash memory devices; magnetic disks such as internal hard disks and removable disks; magneto-optical disks; and CD-ROM and DVD-ROM disks.

The instructions 424 can further be transmitted or received over a communications network 426 using a transmission medium via the network interface device 420 utilizing any one of a number of transfer protocols (e.g., frame relay, IP, TCP, UDP, HTTP, etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., IEEE 802.11 standards family known as Wi-Fi®, IEEE 802.16 standards family known as WiMax®), peer-to-peer (P2P) networks, among others. The term "transmission medium" shall be taken to include any intangible medium that is capable of storing, encoding or carrying instructions for execution by the machine, and includes digital or analog communications signals or other intangible medium to facilitate communication of such software.

The terminology used herein is for the purpose of describing embodiments only and is not intended to be limiting to other embodiments. As used herein, the singular forms "a", "an" and "the" are intended to include the plural forms as well, unless the context clearly indicates otherwise. It will be further understood that the terms "comprises," "comprising," "includes" and/or "including", "have" and/or "having" when used herein, specify the presence of stated features, integers, steps, operations, elements, and/or components, but do not preclude the presence or addition of one or more other features, integers, steps, operations, elements, components, and/or groups thereof. Elements described as being "to" perform functions, acts and/or operations may be configured to or other structured to do so.

Unless otherwise defined, all terms (including technical and scientific terms) used herein have the same meaning as commonly understood by one of ordinary skill in the art to which various embodiments described herein belong. It will be further understood that terms used herein should be interpreted as having a meaning that is consistent with their meaning in the context of this specification and the relevant art and will not be interpreted in an idealized or overly formal sense unless expressly so defined herein.

As will be appreciated by one of skill in the art, various embodiments described herein may be embodied as a method, data processing system, and/or computer program product. Furthermore, embodiments may take the form of a computer program product on a tangible computer readable storage medium having computer program code embodied in the medium that can be executed by a computer.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wired, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages, such as a programming language for a FPGA, Verilog, System Verilog, Hardware Description language (HDL), and VHDL. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computer environment or offered as a service such as a Software as a Service (SaaS).

Some embodiments are described herein with reference to flowchart illustrations and/or block diagrams of methods, systems, and computer program products according to embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall support claims to any such combination or subcombination.

While the foregoing is directed to aspects of the present disclosure, other and further embodiments of the disclosure may be devised without departing from the basic scope thereof, and the scope thereof is determined by the claims that follow.

What is claimed:

1. A method of monitoring a condition of a SiC MOSFET, the method comprising:
    (a) applying a first voltage across a gate-source of a SiC MOSFET in-situ that is greater than a specified threshold voltage for the SiC MOSFET to conduct a current though a channel region in the SiC MOSFET;
    (b) determining whether the current exceeds a target current that is pre-selected to monitor a drain-source saturation mode resistance of the SiC MOSFET in-situ;
    (c) increasing the first voltage by an increment and iteratively performing (a) and (b) until the current exceeds the target current whereupon the first voltage is designated as a test gate-source voltage to be used in monitoring the drain-source saturation mode resistance of the SiC MOSFET in-situ; and then
    detecting a power-on event associated with operation of the SiC MOSFET in-situ for an application that provides an in-situ drain-source voltage across the SiC MOSFET in-situ;
    applying the test gate-source voltage across the gate-source of the SiC MOSFET;
    determining a drain current conducted though the channel region in the SiC MOSFET responsive to applying the test gate-source voltage; and
    determining the drain-source saturation mode resistance for the SiC MOSFET based on the drain current and the in-situ drain-source voltage.

2. The method according to claim 1 wherein the target current is preselected so that the in-situ drain-source voltage across the SiC MOSFET in-situ provides the target current into a drain of the SiC MOSFET in saturation mode.

3. The method according to claim 1 wherein the target current is preselected so that a change in the drain-source saturation mode resistance is measurable at sufficient resolution over aging of the SiC MOSFET in-situ.

4. The method according to claim 1 wherein the target current is preselected so as to decrease by at least about 30% responsive to the test gate-source voltage and the in-situ drain-source voltage during aging of the SiC MOSFET in-situ.

5. The method of claim 1 wherein applying the test gate-source voltage further comprises applying a test gate-source voltage pulse across the gate-source having a duration including a transient time interval followed by a measurement time interval.

6. The method of claim 5 wherein the duration of the test gate-source voltage pulse is limited to avoid test related aging of the SiC MOSFET due to heating.

7. The method of claim 1 wherein the in-situ drain-source voltage is provided upon completion of the power-on event by a circuit in which the SiC MOSFET is in-situ.

8. The method of claim 1 wherein the test gate-source voltage is provided by a circuit coupled to a gate of the SiC MOSFET.

9. The method of claim 1 wherein the SiC MOSFET is in-situ in a phase-leg based power converter circuit including a shunt resistor coupled in series with a source of the SiC MOSFET, the shunt resistor used to measure the drain current.

10. The method of claim 1 wherein the SiC MOSFET is in-situ in a circuit including a current sensor coupled in series with the drain of the SiC MOSFET in series with an inductive load.

* * * * *